(12) United States Patent
Trachewsky et al.

(10) Patent No.: US 8,392,786 B2
(45) Date of Patent: Mar. 5, 2013

(54) LDPC CODING SYSTEMS FOR 60 GHZ MILLIMETER WAVE BASED PHYSICAL LAYER EXTENSION

(75) Inventors: Jason A. Trachewsky, Menlo Park, CA (US); Ba-Zhong Shen, Irvine, CA (US); Andrew J. Blanksby, Neptune, NJ (US); Joonsuk Kim, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 943 days.

(21) Appl. No.: 12/435,821

(22) Filed: May 5, 2009

(65) Prior Publication Data

US 2009/0282315 A1    Nov. 12, 2009

Related U.S. Application Data

(60) Provisional application No. 61/051,319, filed on May 7, 2008, provisional application No. 61/051,415, filed on May 8, 2008.

(51) Int. Cl.
*H03M 13/00* (2006.01)
*H03M 13/03* (2006.01)

(52) U.S. Cl. ........ 714/752; 714/755; 714/782; 714/784; 714/786; 714/790

(58) Field of Classification Search .................. 714/755, 714/752, 782, 784, 786, 790
See application file for complete search history.

(56) References Cited

U.S. PATENT DOCUMENTS

| 6,311,306 | B1 * | 10/2001 | White et al. | 714/790 |
|---|---|---|---|---|
| 6,831,574 | B1 * | 12/2004 | Mills et al. | 341/50 |
| 7,139,964 | B2 * | 11/2006 | Shen et al. | 714/758 |
| 7,213,197 | B2 * | 5/2007 | Jacobsen et al. | 714/800 |
| 7,490,282 | B2 * | 2/2009 | Spencer et al. | 714/755 |
| 7,577,207 | B2 * | 8/2009 | Eroz et al. | 375/261 |
| 7,661,037 | B2 * | 2/2010 | Niu et al. | 714/701 |
| 7,827,450 | B1 * | 11/2010 | Yang et al. | 714/704 |
| 7,966,505 | B2 * | 6/2011 | Gao et al. | 713/320 |
| 8,010,852 | B1 * | 8/2011 | Yang et al. | 714/718 |
| 8,102,947 | B2 * | 1/2012 | Eroz et al. | 375/322 |
| 8,156,390 | B2 * | 4/2012 | Palanki et al. | 714/701 |
| 8,171,367 | B2 * | 5/2012 | Gao et al. | 714/752 |
| 8,176,402 | B2 * | 5/2012 | Yokokawa et al. | 714/800 |
| 8,179,955 | B2 * | 5/2012 | Taylor et al. | 375/230 |
| 8,181,085 | B2 * | 5/2012 | Eroz et al. | 714/758 |

(Continued)

OTHER PUBLICATIONS

Huang, Bit-Interleaved Time-Frequency Coded Modulation for OFDM Systems Over Time-Varying Channels, Jul. 2005, IEEE, vol. 53, No. 7, 1191-1199.*

(Continued)

*Primary Examiner* — John J Tabone, Jr.
(74) *Attorney, Agent, or Firm* — Garlick & Markison; Shayne X. Short

(57) ABSTRACT

LDPC coding systems for 60 GHz millimeter wave based physical layer extension. LDPC (Low Density Parity Check) encoding in cooperation with sub-carrier interleaving, in the context of orthogonal frequency division multiplexing (OFDM), and appropriate symbol mapping is performed in accordance with transmit processing as may be performed within a communication device. In a receiving communication device, receive processing may be performed on a received signal based on the type of LDPC, sub-carrier interleaving, and symbol mapping thereof. The LDPC code employed in accordance with such LDPC encoding may have a partial-tree like structure. In addition, appropriate manipulation of the bits assigned to respective sub-carriers may be performed to ensure that the bits emplaced in the MSB (Most Significant Bit) location of various symbols has some desired diversity (e.g., from different codewords, from appropriately different locations within a given codeword, etc.).

20 Claims, 26 Drawing Sheets

U.S. PATENT DOCUMENTS

| | | | | |
|---|---|---|---|---|
| 2006/0104379 | A1* | 5/2006 | Li et al. | 375/267 |
| 2007/0260959 | A1* | 11/2007 | Sidi et al. | 714/755 |
| 2008/0163026 | A1* | 7/2008 | Varnica et al. | 714/755 |
| 2009/0052503 | A1* | 2/2009 | Santoru et al. | 375/148 |
| 2009/0158114 | A1* | 6/2009 | Shokrollahi | 714/752 |
| 2010/0002792 | A1* | 1/2010 | Seyedi-Esfahani | 375/260 |
| 2011/0131464 | A1* | 6/2011 | Ko et al. | 714/752 |

OTHER PUBLICATIONS

R. Gallager, Low-Density Parity-Check Codes, Cambridge, MA: MIT Press, 1963.

R. G. Gallager, "Low density parity check codes," IRE Trans. Info. Theory, vol. IT-8, Jan. 1962, pp. 21-28.

M. G. Luby, M. Mitzenmacher, M. A. Shokrollahi, D. A. Spielman, and V. Stemann, "Practical Loss-Resilient Codes," Proc. 29th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, No. 2, Feb. 2001, pp. 599-618.

ETSI EN 302 307, V1.1.2 (Jun. 2006), "Digital Video Broadcasting (DVB); Second generation framing structure, channel coding and modulation system for Broadcasting, Interactive Services, News Gathering and other broadband satellite applications," 74 pages.

IEEE P802.11nTM/D1.0, "IEEE P802.11n™/D1.0 Draft Amendment to Standard [FOR] Information Technology—Telecommunications and information exchange between systems—Local and Metropolitan networks—Specific requirements—Part 11: Wireless LAN Medium Access Control (MAC) and Physical Layer (PHY) specifications: Enhancements for Higher Throughput," Mar. 2006, 335 pages.

IEEE Std 802.16eTM-2005, "IEEE Standard for Local and metropolitan area networks; Part 16: Air Interface for Fixed and Mobile Broadband Wireless Access Systems; Amendment 2: Physical and Medium Access Control Layers for Combined Fixed and Mobile Operation in Licensed Bands and Corrigendum 1," 864 pages.

Niclas Wiberg (1996), "Codes and Decoding on General Graphs," Unpublished doctoral dissertation, University of Linkoping, Sweden, 108 pages.

\* cited by examiner

Fig. 4B (check node update)

Fig. 4A (variable node update)

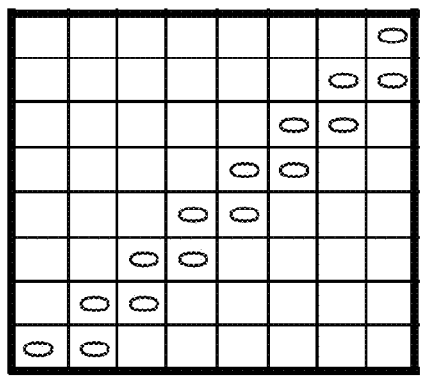
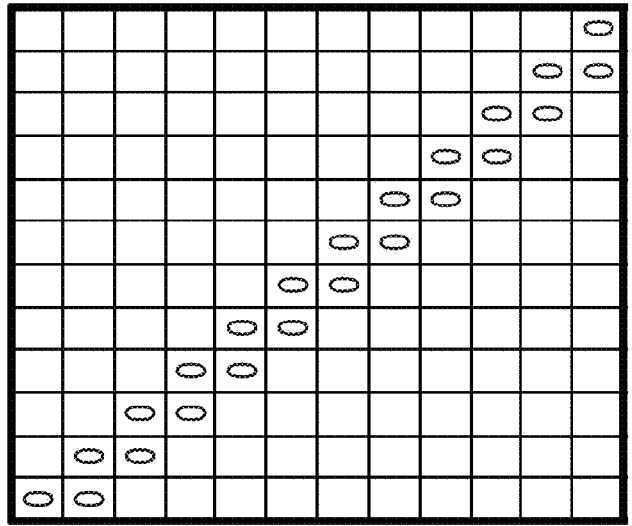
Fig. 10

Fig. 11 option 1, rate 1/2 LDPC parity check matrix, H 1100

| | | | | | | | | | | | |
|---|---|---|---|---|---|---|---|---|---|---|---|
| - | - | - | - | - | - | - | - | - | - | - | 0 |
| - | - | - | - | - | - | - | - | - | - | 0 | 0 |
| - | - | - | - | - | - | - | - | - | 0 | 0 | - |
| - | - | - | - | - | - | - | - | 0 | 0 | - | - |
| - | - | - | - | - | - | - | 0 | 0 | - | - | - |
| - | - | - | - | - | - | 0 | 0 | - | - | - | - |
| - | - | - | - | - | 0 | 0 | - | - | - | - | - |
| - | - | - | - | 0 | 0 | - | - | - | - | - | - |
| - | - | - | 0 | 0 | - | - | - | - | - | - | - |
| - | - | 0 | 0 | - | - | - | - | - | - | - | - |
| - | 0 | 0 | - | - | - | - | - | - | - | - | - |
| 0 | 0 | - | - | - | - | - | - | - | - | - | - |
| - | 25 | - | 2 | - | - | - | 3 | - | - | - | - |
| - | 5 | - | - | - | - | - | 16 | 1 | - | - | - |
| 15 | - | - | - | 7 | - | - | - | - | - | 16 | - |
| - | - | - | - | 8 | 3 | - | - | - | 25 | - | - |
| - | - | 22 | 13 | - | - | 22 | - | - | - | - | - |
| - | - | - | - | - | 25 | 18 | - | - | - | - | 20 |
| - | - | 14 | - | - | - | - | - | 0 | - | 17 | - |
| - | - | 12 | - | 9 | - | - | - | - | - | - | 6 |
| 14 | - | - | - | - | - | - | - | - | - | 1 | 23 |
| 26 | 14 | 0 | 27 | 11 | 18 | 26 | 9 | 26 | 14 | 1 | 15 |
| 18 | 20 | 1 | 26 | 20 | 2 | 16 | 19 | 11 | 10 | 12 | 10 |
| 23 | 1 | 7 | 22 | 27 | 0 | 19 | 10 | 12 | 26 | 14 | 5 |

Fig. 13 option 1, rate 3/4 LDPC parity check matrix, H 1300

| 10 | 8 | 5 | 1 | 24 | 25 | 19 | 13 | – | – | 2 | – | 15 | – | – | 26 | – | 22 | 21 | – | – | – | – | – |
|---|---|---|---|---|---|---|---|---|---|---|---|---|---|---|---|---|---|---|---|---|---|---|---|
| 6 | 22 | 11 | 24 | 18 | – | – | 16 | 5 | – | – | 20 | – | 10 | – | 13 | 9 | – | 0 | 0 | – | – | – | – |
| 19 | 25 | 5 | 2 | 27 | 1 | 10 | – | 23 | – | – | 24 | 3 | – | – | – | – | 26 | 0 | – | 0 | 0 | – | – |
| 0 | 17 | 26 | 25 | 6 | – | 13 | – | – | 23 | 2 | – | 16 | 23 | 21 | – | – | – | – | – | – | 0 | 0 | – |
| 26 | 19 | 5 | 8 | 20 | 20 | – | 2 | 22 | – | 25 | – | – | 11 | 1 | 16 | – | 23 | – | – | – | – | 0 | 0 |
| 20 | 25 | 26 | 21 | 24 | – | 17 | 9 | – | – | 15 | 8 | – | 6 | – | 13 | 22 | – | – | – | – | – | – | 0 |

Fig. 22 (2 bits per sub-carrier, e.g., QPSK)

Fig. 23 (4 bits per sub-carrier, e.g., 16 QAM)

Fig. 24 (6 bits per sub-carrier, e.g., 64 QAM)

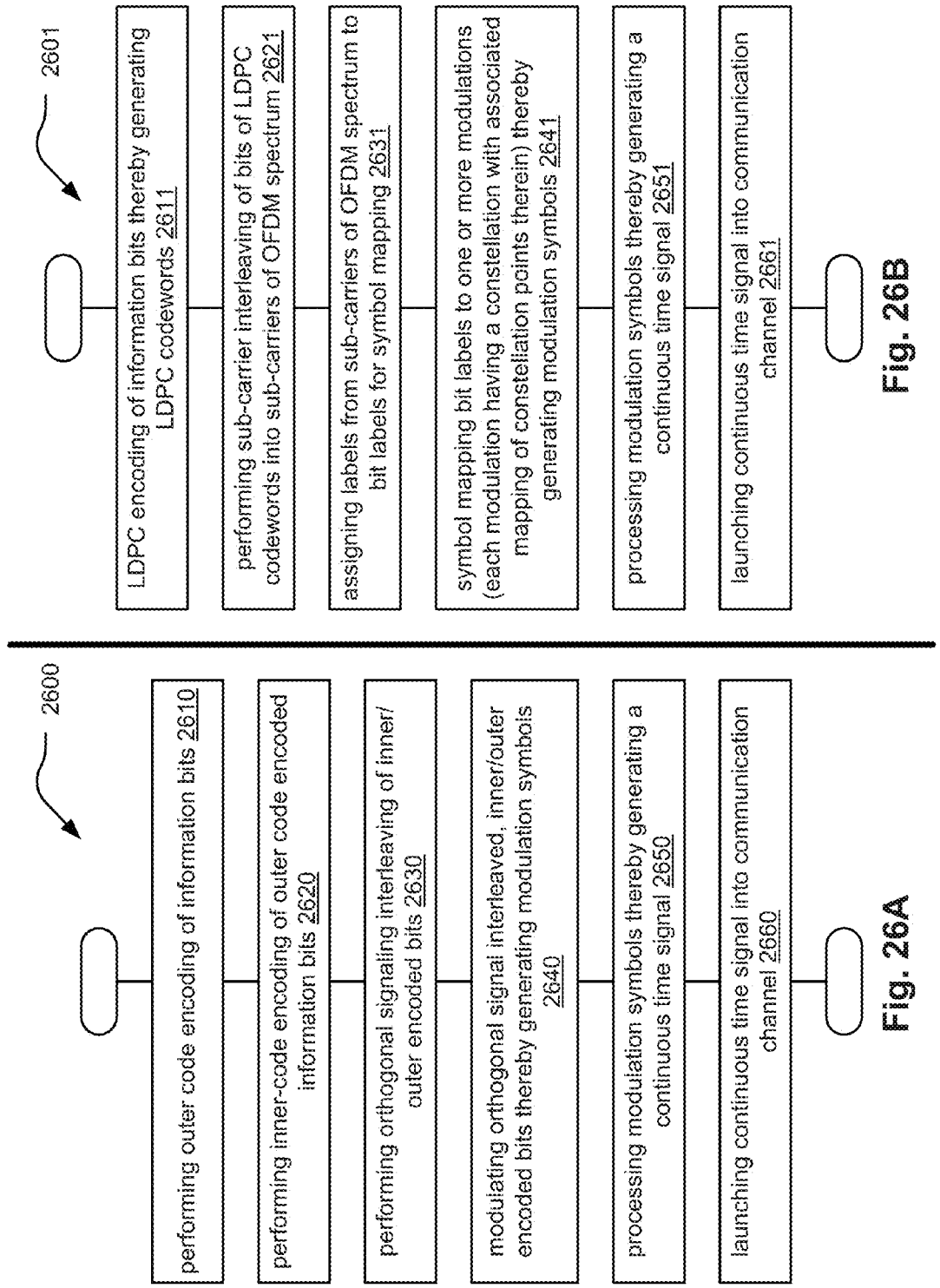

LDPC CODING SYSTEMS FOR 60 GHZ MILLIMETER WAVE BASED PHYSICAL LAYER EXTENSION

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:

1. U.S. Provisional Application Ser. No. 61/051,319, entitled "LDPC coding systems for 60 GHz millimeter wave based physical layer extension," filed 05-07-2008, pending.

2. U.S. Provisional Application Ser. No. 61/051,415, entitled "LDPC coding systems for 60 GHz millimeter wave based physical layer extension," filed 05-08-2008, pending.

Incorporation By Reference

The following U.S. Utility Patent Applications are hereby incorporated herein by reference in their entirety and made part of the present U.S. utility patent application for all purposes:

1. U.S. Utility patent application Ser. No. 11/292,135, entitled "Algebraic construction of LDPC (Low Density Parity Check) codes with corresponding parity check matrix having CSI (Cyclic Shifted Identity) sub-matrices," filed 12-01-2005, pending.

2. U.S. Utility patent application Ser. No. 11/472,226, entitled "Efficient Construction of LDPC (Low Density Parity Check) Codes with Corresponding Parity Check Matrix Having CSI (Cyclic Shifted Identity) Sub-Matrices," filed 06-21-2006, pending.

3. U.S. Utility patent application Ser. No. 11/472,256, entitled "Efficient Construction of LDPC (Low Density Parity Check) Codes with Corresponding Parity Check Matrix Having CSI (Cyclic Shifted Identity) Sub-Matrices," filed 06-21-2006, pending."

BACKGROUND OF THE INVENTION

1. Technical Field of the Invention

The invention relates generally to sub-carrier interleaving and modulation in accordance with orthogonal signaling within communication systems; and, more particularly, it relates to communication systems providing for maximal separation of bits among various orthogonal signals within such communication systems.

2. Description of Related Art

Data communication systems have been under continual development for many years. One such type of communication system that has been of significant interest lately is a communication system that employs iterative error correction codes (ECCs). Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code with a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 10 illustrates possible embodiments of the matrix, $B_0$, for the code rates of 1/2, 2/3, and 3/4, respectively.

FIG. 11, FIG. 12, and FIG. 13 illustrate embodiments of various LDPC parity check matrices, H, for the code rates of 1/2, 2/3, and 3/4, respectively.

FIG. 26A illustrates an embodiment of a method for performing transmit processing.

FIG. 26B illustrates an alternative embodiment of a method for performing transmit processing.

DETAILED DESCRIPTION OF THE INVENTION

The code construction techniques, architectures, and/or approach presented herein can be employed within a wide variety of communication systems, some types of which are described below.

Figure 1:
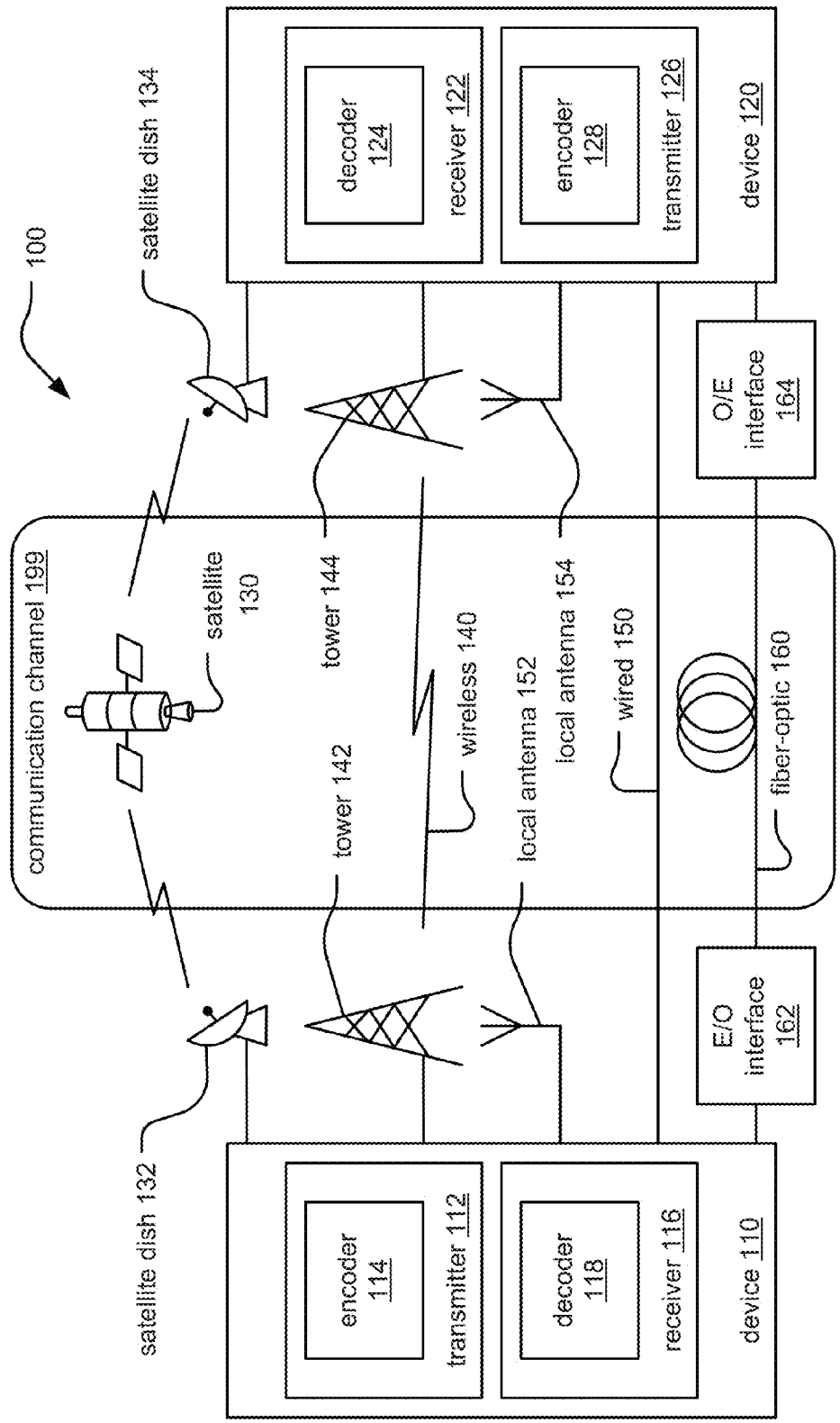
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
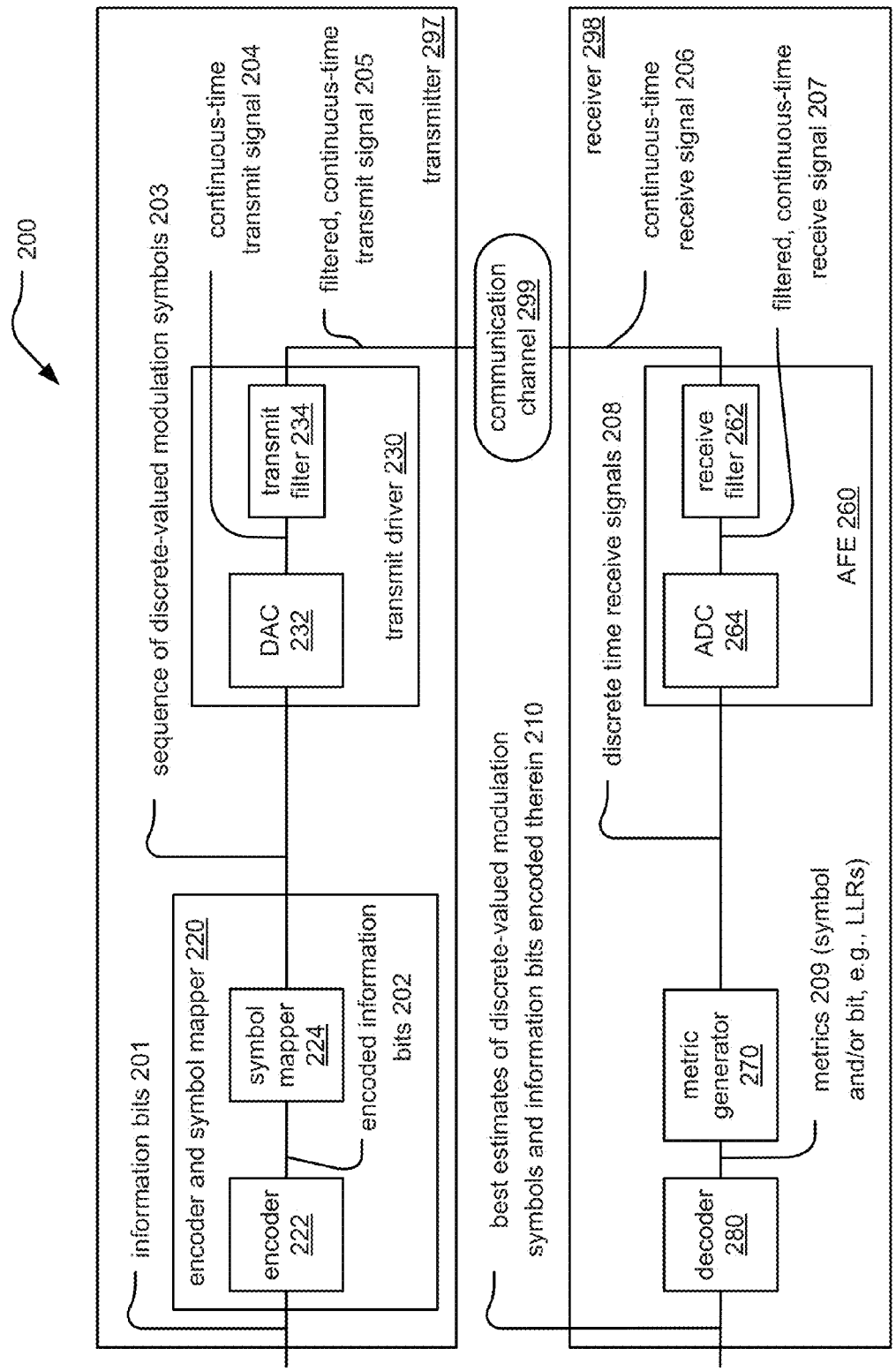

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of LDPC codes described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. A general description of LDPC codes is provided below as well.

Figure 3:
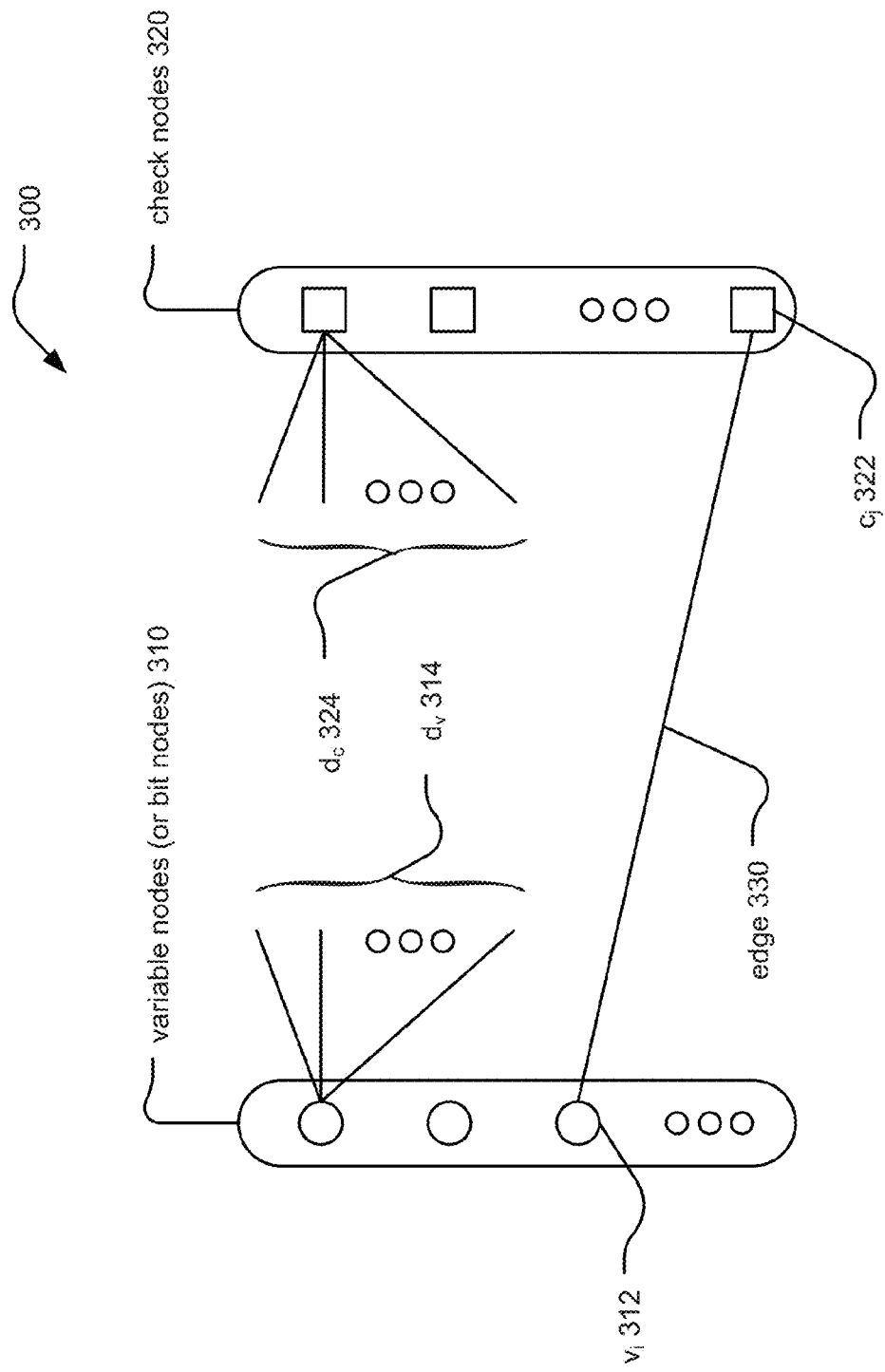
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a "Tanner" graph. An LDPC code may be viewed as being a code having a binary parity check matrix such that nearly all of the elements of the matrix have values of zeroes (e.g., the binary parity check matrix is sparse). For example, H= $(h_{i,j})_{M \times N}$ may be viewed as being a parity check matrix of an LDPC code with block length N.

LDPC codes are linear block codes and hence the set of all codewords x∈C spans the null space of a parity check matrix, H.

$$Hx^T=0, \forall x \in C \quad (1)$$

For LDPC codes, H, is a sparse binary matrix of dimension m×n. Each row of H corresponds to a parity check and a set element $h_{i,j}$ indicates that data symbol j participates in parity check i. Each column of H corresponds to a codeword symbol.

For each codeword x there are n symbols of which m are parity symbols. Hence the code rate r is given by:

$$r=(n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d$ for all i, and $d_c(j)=d_c$ for all j, then the LDPC code is called a $(d_v, d_c)$ regular LDPC code, otherwise the LDPC code is called an irregular LDPC code.

LDPC codes were introduced by R. Gallager in [1] referenced below (also in [2] referenced below) and by M. Luby et al. in [3] also referenced below.

[1] R. Gallager, *Low-Density Parity-Check Codes*, Cambridge, Mass.: MIT Press, 1963.

[2] R. G. Gallager, "Low density parity check codes," *IRE Trans. Info. Theory*, vol. IT-8, January 1962, pp. 21-28.

[3] M. G. Luby, M. Mitzenmacher, M. A. Shokrollahi, D. A. Spielman, and V. Stemann, "Practical Loss-Resilient Codes," Proc. 29$^{th}$ *Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 (or sometimes referred to as a Tanner graph 300) of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 330 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 320 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i,j). However, on the other hand, given an edge e=(i,j), the nodes of the edge may alternatively be denoted as by e=(v(e),c(e)) (or e=(b(e), c(e))). Alternatively, the edges in the graph correspond to the set elements of H where a set element $h_{j,i}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$ of an irregular LDPC code, $|E_v(i_1)|$ may not equal to $|E_v(i_2)|$. This relationship may also hold true for two check nodes. The concept of irregular LDPC codes was originally introduced within M. Luby et al. in [3] referenced above.

In general, with a graph of an LDPC code, the parameters of an LDPC code can be defined by a degree of distribution, as described within M. Luby et al. in [3] referenced above and also within the following reference [4]:

[4] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

Figure 4:
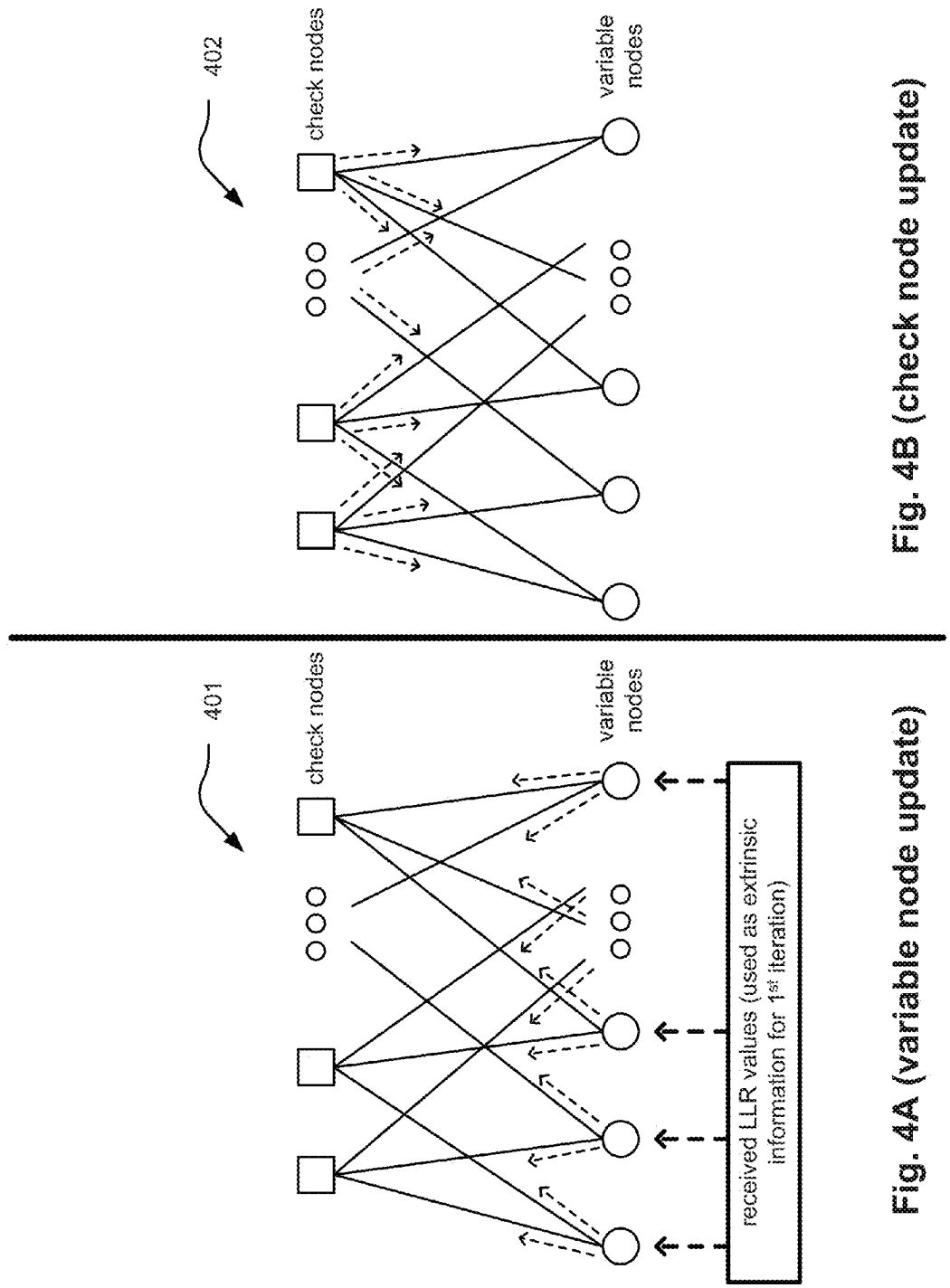
FIG. 4A illustrates an embodiment of variable node update with reference to an LDPC code bipartite graph.
FIG. 4B illustrates an embodiment of check node update with reference to an LDPC code bipartite graph.

FIG. 4A illustrates an embodiment 401 of variable node update with reference to an LDPC code bipartite graph. FIG. 4B illustrates an embodiment 402 of check node update with reference to an LDPC code bipartite graph. These two diagrams may be considered in conjunction with one another.

A signal received from a communication channel undergoes appropriate demodulation (e.g., processing within an analog front end including digital sampling, filtering, gain adjustment, etc.) to generate a received bit sequence. Then, log-likelihood ratios (LLRs) are calculated for each bit location within the received bit sequence. These LLRs correspond respectively to bit nodes of the LDPC code and its corresponding LDPC bipartite graph.

During initialization, the LLRs are employed for the bit edge messages (e.g., extrinsic information) for each edge emanating from each respective variable node. Thereafter, check node processing or check node updating is performed using the original bit edge messages (e.g., the calculated LLRs). These updated check edge messages are then employed to perform bit node processing or bit node updating to update the variable node soft information for use in the next decoding iteration. The variable node soft information is then used to calculate the variable node edge messages (extrinsic information) for this next decoding iteration.

These variable node edge messages are then used in accordance with check node processing or check node updating to calculate updated check edge messages. Subsequently, these most recently updated check edge messages are then employed to perform bit node processing or bit node updating to update the variable node soft information once again.

After a final decoding iteration, which may be determined based on some parameter (e.g., a predetermined number of decoding iterations or when all syndromes of the LDPC code equal zero), the last calculated variable node soft information may undergo hard limiting (e.g., in a slicer) to generate estimates of the bits encoded within the received signal.

Figure 5:
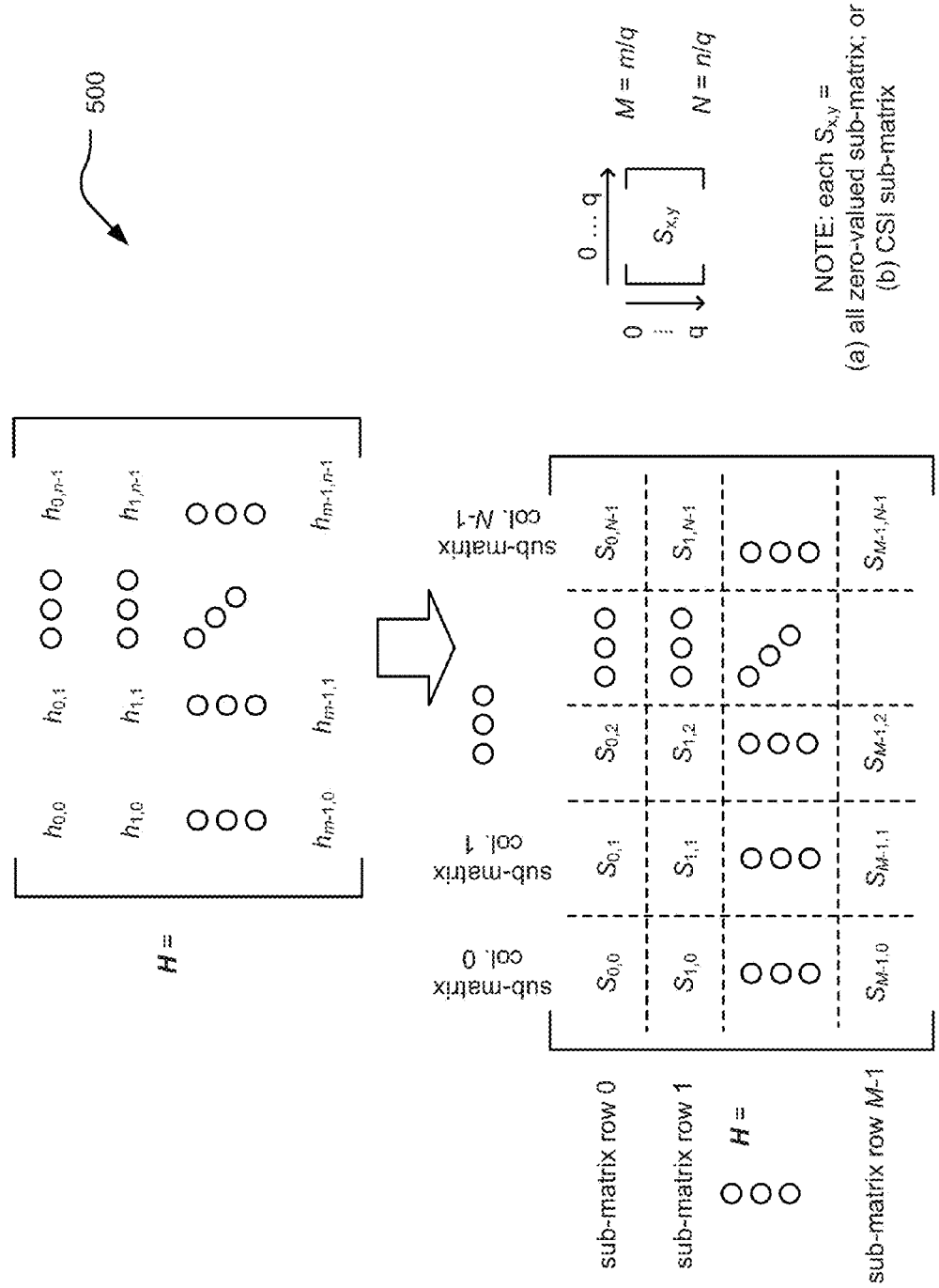
FIG. 5 illustrates an embodiment of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

FIG. 5 illustrates an embodiment 500 of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

A binary LDPC code may be fully described by its parity check matrix (i.e., its LDPC matrix). At the top of FIG. 5, the individual elements of an LDPC matrix, H, are shown:

$$H = \begin{bmatrix} h_{0,0} & h_{0,1} & \cdots & h_{0,n-1} \\ h_{1,0} & h_{1,1} & \cdots & h_{1,n-1} \\ \vdots & \vdots & \ddots & \vdots \\ h_{m-1,0} & h_{m-1,1} & \cdots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $Hc^T=0$.

For such an LDPC code, the parity matrix H is also composed of a number of q-by-q (i.e., q×q) square sub-matrices as shown in the bottom portion of FIG. 5 and also below:

$$H = \begin{bmatrix} S_{0,0} & S_{0,1} & \cdots & S_{0,N-1} \\ S_{1,0} & S_{1,1} & \cdots & S_{1,N-1} \\ \vdots & \vdots & \ddots & \vdots \\ S_{M-1,0} & S_{M-1,1} & \cdots & S_{M-1,N-1} \end{bmatrix}$$

where M=m/q, N=n/q, and each sub-matrix, $S_{I,J}$, thereof is a q-by-q sub-matrix that is either an all zero-valued sub-matrix (i.e., in which all elements thereof are the value of zero "0", which is depicted by a blank, empty, or "–" indicated sub-matrix in the associated diagrams) or a CSI (Cyclic Shifted Identity) sub-matrix. A CSI sub-matrix S is characterized by a shift-value, λ(S), such that the components of S are defined as follows:

$$s_{i,j} = \begin{cases} 1 & \text{if } i + \lambda(S) = j(\bmod q) \\ 0 & \text{otherwise} \end{cases}$$

for any i and j, with $0 \leq i < q$ and $0 \leq j < q$. For example, the q-by-q identity matrix is itself a CSI matrix with a shift-value λ(S)=0 (i.e., a CSI sub-matrix that has undergone a cyclic shift of zero "0").

As can be seen, the LDPC matrix (as depicted in the lower portion of the diagram), includes various sub-matrix rows and sub-matrix columns. These sub-matrix rows and sub-matrix columns may be viewed as being based on the sub-matrix construction of the LDPC matrix (e.g., shown as sub-matrix rows 0 through M–1 and sub-matrix columns 0 through N–1).

Moreover, in the context of signals and coding types described herein and that may be employed in embodiments depicted herein, the use of OFDM (Orthogonal Frequency Division Multiplexing) modulation is employed.

OFDM modulation may be viewed a dividing up an available frequency spectrum into a plurality of narrowband sub-carriers (e.g., lower data rate carriers). Typically, the frequency responses of these sub-carriers are overlapping and orthogonal to one another. Each sub-carrier may be modulated using any of a variety of modulation coding techniques (e.g., using LDPC coding for channel coding in accordance with any of the embodiments depicted herein).

OFDM modulation operates by performing simultaneous transmission of a larger number of narrowband carriers (or multi-tones). Oftentimes a guard interval or guard space is also employed between the various OFDM symbols to try to minimize the effects of ISI (Inter-Symbol Interference) that may be caused by the effects of multi-path within the communication system (which can be particularly of concern in wireless communication systems). In addition, a CP (Cyclic Prefix) may also be employed within the guard interval to allow switching time (when jumping to a new band) and to help maintain orthogonality of the OFDM symbols.

In one UWB (Ultra WideBand) embodiment, 125 OFDM tones may be implemented in any one of the 15 sub-bands of 500 MHz bandwidth within the UWB spectrum.

In even another embodiment operating in the 60 GHz millimeter wave context, one OFDM symbol may have 336 sub-carriers. Every sub-carrier may also carry a symbol having any desired modulation type (e.g., QPSK (Quadrature Phased Shift Keying), 16 QAM (Quadrature Amplitude Modulation), 64 QAM, even other modulation types including higher or lower ordered modulation types, etc.). In accordance with such a system, the channel coding employed therein to generate the encoded bits (e.g., from which the OFDM symbols are generated) may employ LDPC coding. In addition, the channel coding employed therein that operates on the OFDM symbols may be employ LDPC coding. A channel coding system that operates on such OFDM symbols is described herein.

Other benefits are achieved using OFDM. For example, the use of multi-tones allows for an effective solution to deal with narrowband interference. For example, a tone that corresponds to the locality of the narrowband interference may be turned off (to eliminate the susceptibility to this narrowband interference) and still provide for efficient operation. This turning off of these one or few tones will not result in a great loss of bandwidth because each individual tone does not occupy a great deal of bandwidth within the available spectrum employed by the OFDM symbol. Therefore, OFDM modulation provides a solution that may be employed in accordance with invention that provides link quality intelligence from the PHY (physical layer) to the higher protocol layers within devices operating within wireless networks (e.g., piconets as one example).

Details related to the type of LDPC code structure that may be employed herein are presented below. The LDPC code bipartite graph (or Tanner graph) of such an LDPC code has a partial tree-like structure. A few Types of LDPC codes are presented below to compare to an LDPC code having a partial-tree like structure.

A popular used LDPC parity check matrix in the industry is constructed by two kinds of matrices. One is a base binary matrix (B). The other is a set of size q binary sub-matrices; these sub-matrices are either binary permutation matrices (e.g., cyclic shifted identity matrices) or all zero matrices.

Herein, we denote this kind of LDPC code structure by $(B,\{P_{i,j}\})$, where B is the base matrix and $\{P_{i,j}\}$ is a set of binary sub-matrices therein. The final LDPC parity check matrix, H, is obtained by replacing all of non-zero elements in the base matrix, B, by a sub-matrix (e.g., $\{P_{i,j}\}$) and by replacing all of zero elements in the base matrix, B, by an all-zero valued sub-matrix (e.g., all elements therein are '0'). For example, define a base matrix as follows:

$$B = \begin{bmatrix} 1 & 1 & 0 & 0 \\ 0 & 1 & 1 & 0 \\ 1 & 0 & 0 & 1 \end{bmatrix}$$

And the 6 separate size 3×3 permutation sub-matrices are depicted as follows:

$$P_{00} = \begin{bmatrix} 1 & 0 & 0 \\ 0 & 1 & 0 \\ 0 & 0 & 1 \end{bmatrix} = I(0), P_{01} = \begin{bmatrix} 0 & 1 & 0 \\ 0 & 0 & 1 \\ 1 & 0 & 0 \end{bmatrix} = I(1),$$

$$P_{11} = \begin{bmatrix} 0 & 0 & 1 \\ 1 & 0 & 0 \\ 0 & 1 & 0 \end{bmatrix} = I(2), P_{12} = \begin{bmatrix} 0 & 1 & 0 \\ 0 & 0 & 1 \\ 1 & 0 & 0 \end{bmatrix} = I(1)$$

$$P_{20} = \begin{bmatrix} 0 & 0 & 1 \\ 1 & 0 & 0 \\ 0 & 1 & 0 \end{bmatrix} = I(2), P_{23} = \begin{bmatrix} 1 & 0 & 0 \\ 0 & 1 & 0 \\ 0 & 0 & 1 \end{bmatrix} = I(0)$$

where I(k) stands for the permutation matrix obtained by right cyclic shifting the k columns (or the rows) of the q×q identity matrix (e.g., as can be seen for I(0), I(1), and I(2), above, respectively.

The final LDPC parity check matrix, H, is as follows:

$$H = \begin{bmatrix} P_{00} & P_{01} & 0 & 0 \\ 0 & P_{11} & P_{12} & 0 \\ P_{20} & 0 & 0 & P_{23} \end{bmatrix} = \begin{bmatrix} 1 & 0 & 0 & 0 & 1 & 0 & 0 & 0 & 0 & 0 & 0 & 0 \\ 0 & 1 & 0 & 0 & 0 & 1 & 0 & 0 & 0 & 0 & 0 & 0 \\ 0 & 0 & 1 & 1 & 0 & 0 & 0 & 0 & 0 & 0 & 0 & 0 \\ 0 & 0 & 0 & 0 & 0 & 1 & 0 & 1 & 0 & 0 & 0 & 0 \\ 0 & 0 & 0 & 1 & 0 & 0 & 0 & 0 & 0 & 1 & 0 & 0 \\ 0 & 0 & 0 & 0 & 1 & 0 & 1 & 0 & 0 & 0 & 0 & 0 \\ 0 & 0 & 1 & 0 & 0 & 0 & 0 & 0 & 0 & 1 & 0 & 0 \\ 1 & 0 & 0 & 0 & 0 & 0 & 0 & 0 & 0 & 0 & 1 & 0 \\ 0 & 1 & 0 & 0 & 0 & 0 & 0 & 0 & 0 & 0 & 0 & 1 \end{bmatrix}$$

If the base matrix, B, is a m×n matrix and the sub-matrices therein are of size q, then the size of LDPC parity check matrix, H, is (mq)×(nq) and the LDPC codeword size of that LDPC code is nq.

Furthermore, such an LDPC parity check matrix, H, is constructed so that (n−m)q is the dimension of the LDPC code, i.e. mq is the number of redundancy bits. Moreover, the base matrix, B, can be further decomposed to two parts, namely $B=[B_1 B_0]$, where $B_0$ is an m×m matrix.

The following three types of $B_0$ are may be employed.

Type I $$B_0 = (b_{i,j})_{m \times m} = \begin{bmatrix} 1 & 0 & 0 & \cdots & 0 & 1 \\ 1 & 1 & 0 & \cdots & 0 & 0 \\ 0 & 1 & 1 & \cdots & 0 & 0 \\ \vdots & \vdots & \vdots & \ddots & \vdots & \vdots \\ 0 & 0 & 0 & \cdots & 1 & 0 \\ 0 & 0 & 0 & \cdots & 1 & 1 \end{bmatrix},$$

i.e. $b_{0,m-1}=1$, $b_{i,i}=1, i=0, \ldots, m-1$ and $b_{i,i-1 1}=1, i=1, \ldots, m-1$, and all other entries are zero. Moreover, the corresponded size q sub-matrices for the non-zero positions are as follows:

$P_{0,m-1}=I, P_{i,i}=I, i=0, \ldots, m-1; P_{i,i-1}=I, i=1, \ldots, m-1$ where I is the q×q identity matrix, and $P_{0,m-1}=I(q-1)$ obtained by right cyclically shifting the identity matrix by q−1 columns.

After permuting the rows and columns, the following LDPC parity check matrix, H, can be obtained having the form of, $H=[H_1 H_0]$ where $$H_0 = \begin{bmatrix} 1 & 0 & 0 & \cdots & 0 & 1 \\ 1 & 1 & 0 & \cdots & 0 & 0 \\ 0 & 1 & 1 & \cdots & 0 & 0 \\ \vdots & \vdots & \vdots & \ddots & \vdots & \vdots \\ 0 & 0 & 0 & \cdots & 1 & 0 \\ 0 & 0 & 0 & \cdots & 1 & 1 \end{bmatrix}$$

Figure 6:
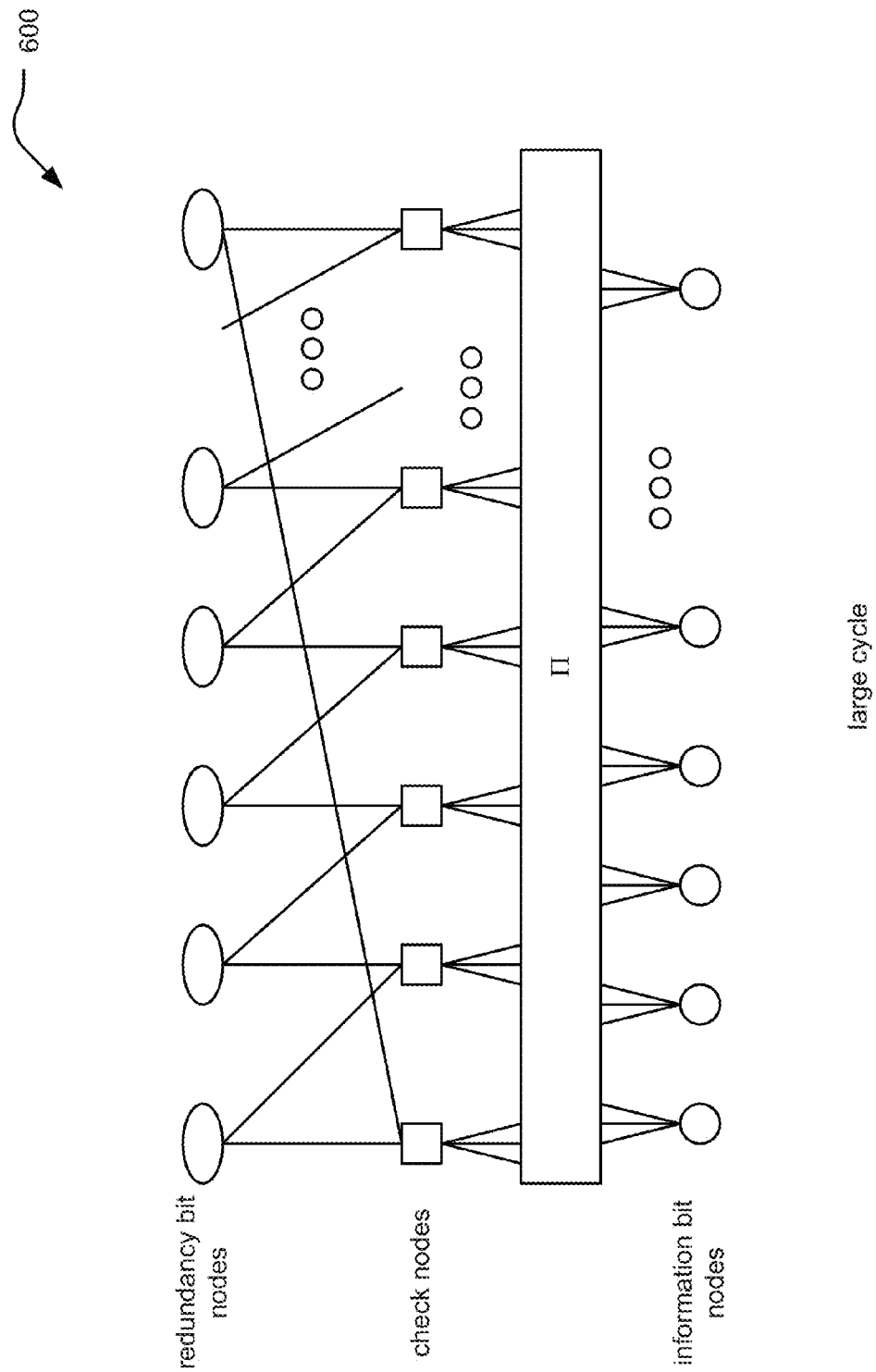
FIG. 6 illustrates an embodiment of a portion of an LDPC (Low Density Parity Check) bipartite graph (or Tanner graph) of Type 1 construction.

From this LDPC parity check matrix, H, we can see that the structure of this LDPC code offers a very large cycle in the Tanner graph of the parity check matrix (E.g., see FIG. 6).

FIG. 6 illustrates an embodiment 600 of a portion of an LDPC (Low Density Parity Check) bipartite graph (or Tanner graph) of Type 1 construction.

Another type of LDPC code is presented below.

Type 2 (used in DVB-S2 standard, see reference [5]).

In this embodiment, the matrix, $B_0$, is the same as in Type 1. The difference of the LDPC code structure is the sub-matrix $P_{0,(m-1)}$. Instead of a full rank $I(q-1)$, the first row of $I(q-1)$ is zeroed to obtain a rank $q-1$ matrix as follows:

$$D = \begin{bmatrix} 0 & 0 & 0 & \ldots & 0 & 0 \\ 1 & 0 & 0 & \ldots & 0 & 0 \\ 0 & 1 & 0 & \ldots & 0 & 0 \\ \vdots & \vdots & \vdots & \ddots & \vdots & \vdots \\ 0 & 0 & 0 & \ldots & 0 & 0 \\ 0 & 0 & 0 & \ldots & 1 & 0 \end{bmatrix}$$

After permuting the rows and columns, the following LDPC parity check matrix, H, can be obtained having the form of, $H[H_1 H_0]$, where the (qm)×(qm) matrix is as follows:

$$H_0 = \begin{bmatrix} 1 & 0 & 0 & \ldots & 0 & 0 \\ 1 & 1 & 0 & \ldots & 0 & 0 \\ 0 & 1 & 1 & \ldots & 0 & 0 \\ \vdots & \vdots & \vdots & \ddots & \vdots & \vdots \\ 0 & 0 & 0 & \ldots & 1 & 0 \\ 0 & 0 & 0 & \ldots & 1 & 1 \end{bmatrix}$$

Figure 7:
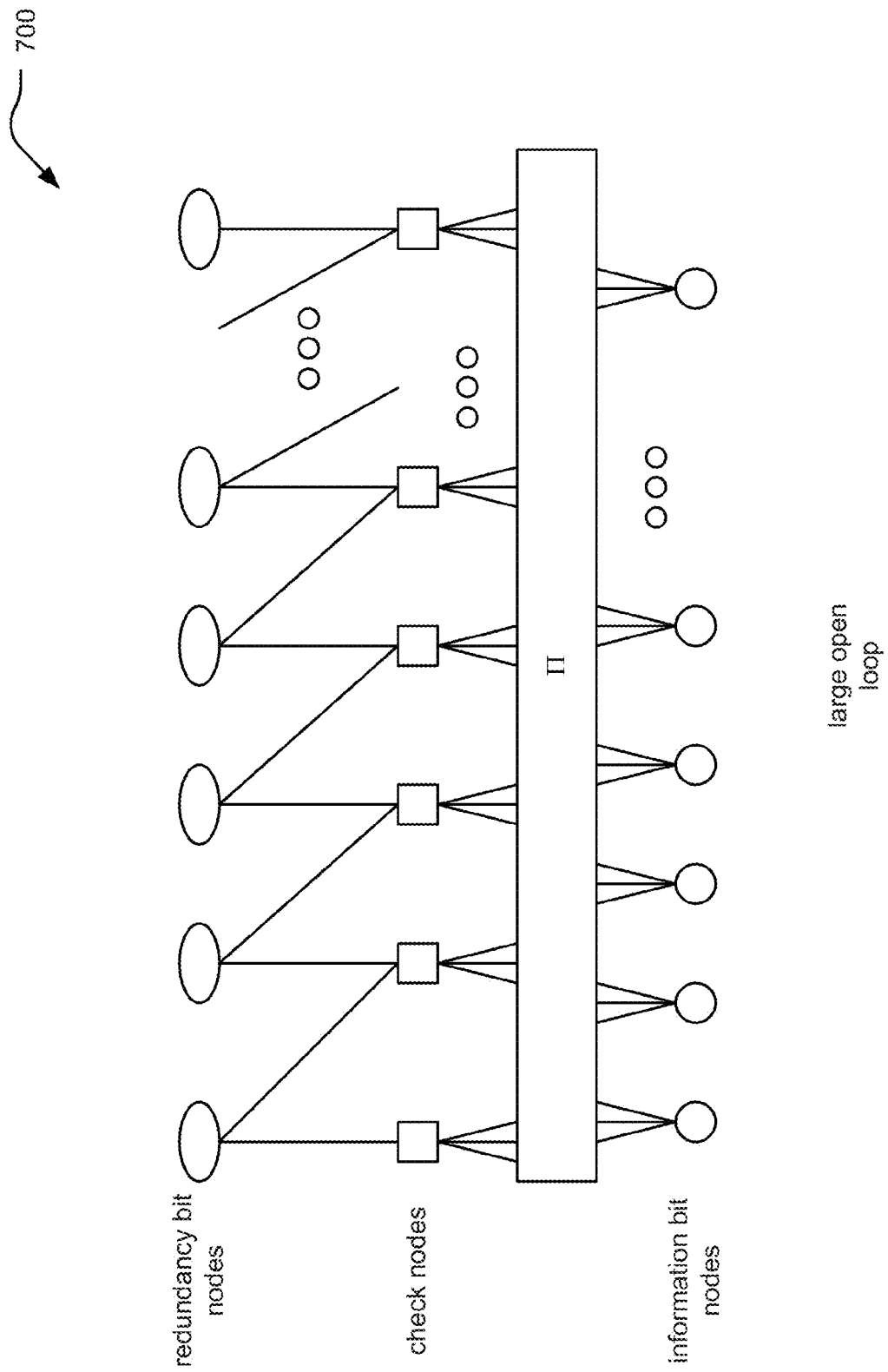
FIG. 7 illustrates an embodiment of a portion of an LDPC bipartite graph (or Tanner graph) of Type 2 construction.

This structure offers a larger open loop in the Tanner graph of the parity check matrix (e.g., see FIG. 7).

FIG. 7 illustrates an embodiment 700 of a portion of an LDPC bipartite graph (or Tanner graph) of Type 2 construction.

Yet another type of LDPC code is presented below.

Type 3 (used in WiMAX (IEEE 802.16e) as in reference [6] and Wi-Fi (IEEE 802.11n) as in reference [7]).

$$B_0 = \begin{bmatrix} 1 & 1 & 0 & \ldots & 0 & \ldots & 0 & 0 \\ 0 & 1 & 1 & \ldots & 0 & \ldots & 0 & 0 \\ & & \ddots & \ddots & & & & \\ 1 & & & 1 & 1 & & 0 & 0 \\ & & & & \ddots & \ddots & & \\ 0 & 0 & 0 & & 0 & \ldots & 1 & 0 \\ 0 & 0 & 0 & 0 & 0 & \ldots & 1 & 1 \\ 1 & 0 & 0 & 0 & 0 & \ldots & 0 & 1 \end{bmatrix}$$

That is, $b_{0,0}=b_{s,0}=b_{m-1,0}=1$, $b_{i,i}=1$, $i=0, \ldots, m-1$ and $b_{i,i+1}=1$, $i=0, \ldots, m-2$. All other entries are zero. Moreover, the corresponding size q sub-matrices for the non-zero positions in the matrix $B_0$ (e.g., from $B=[B_1 B_0]$) are as follows:

$P_{i,i}=I, i=0, \ldots, m-1; P_{i,i+1}=I, i=0, \ldots, m-2$, and $P_{s,0}=1, P_{0,0}=P_{m-1,0}=I(a)$ which are obtained by right cyclically shifting 'a' columns from the identity matrix. One reason that this type of base matrix and corresponding sub-matrices are chosen is that it can use a simplified encoding method as described in reference [4].

A novel type of LDPC code is presented below.

Partial Tree-like Graph Structure (B, $\{P_{i,j}\}$)

The following novel type of LDPC code construction employs the types of sub-matrices described in earlier filed U.S. utility patent applications (which themselves claim priority to earlier-filed U.S. provisional patent applications, respectively) having common inventorship as the present U.S. utility patent application. For example, the types of LDPC parity check matrices, described below, and which are mentioned in the 3 U.S. utility patent applications that have incorporated by reference above, namely:

[a] U.S. Utility patent application Ser. No. 11/292,135;
[b] U.S. Utility patent application Ser. No. 11/472,226; and
[c] U.S. Utility patent application Ser. No. 11/472,256; and they have the form as follows:

$$B_0 = (b_{i,j})_{m \times m} = \begin{bmatrix} 1 & 0 & 0 & \ldots & 0 & 0 \\ 1 & 1 & 0 & \ldots & 0 & 0 \\ 0 & 1 & 1 & \ldots & 0 & 0 \\ \vdots & \vdots & \vdots & \ddots & \vdots & \vdots \\ 0 & 0 & 0 & \ldots & 1 & 0 \\ 0 & 0 & 0 & \ldots & 1 & 1 \end{bmatrix}$$

i.e. $b_{i,i}=1, i=0, \ldots, m-1$ and $b_{i,i-1}=1, i=1, \ldots, m-1$, and all other entries are zero.

Moreover, the corresponding size q sub-matrices employed therein for the non-zero positions in the matrix $B_0$ need not necessary be identity matrices. They can be any desired permutation matrices (e.g., cyclic shifted identity matrices, or other permuted matrices, etc.).

The following are two benefits this construction brings:

(1) Since $B_0$ is a lower-triangular matrix, the LDPC parity check matrix, H, constructed by (B, $\{P_{i,j}\}$) can be directly used for encoding.

(2) When taking $P_{i,i}=I, i=0, \ldots, m-1; P_{i,i-1}=I, i=1, \ldots, m-1$, and after certain row and/or column permutation, one can obtain an LDPC code such that a part of its LDPC bipartite graph (or Tanner graph) with bit nodes corresponding to redundancy bits is a tree-like graph (e.g., see FIG. 4 as an example). Since it is proved in reference [8] that if the graph is a finite tree, the belief propagation decoding algorithm will converge in a finite number of decoding iterations. This tree-like LDPC code will, at a minimum, lower the error floor.

Figure 8:
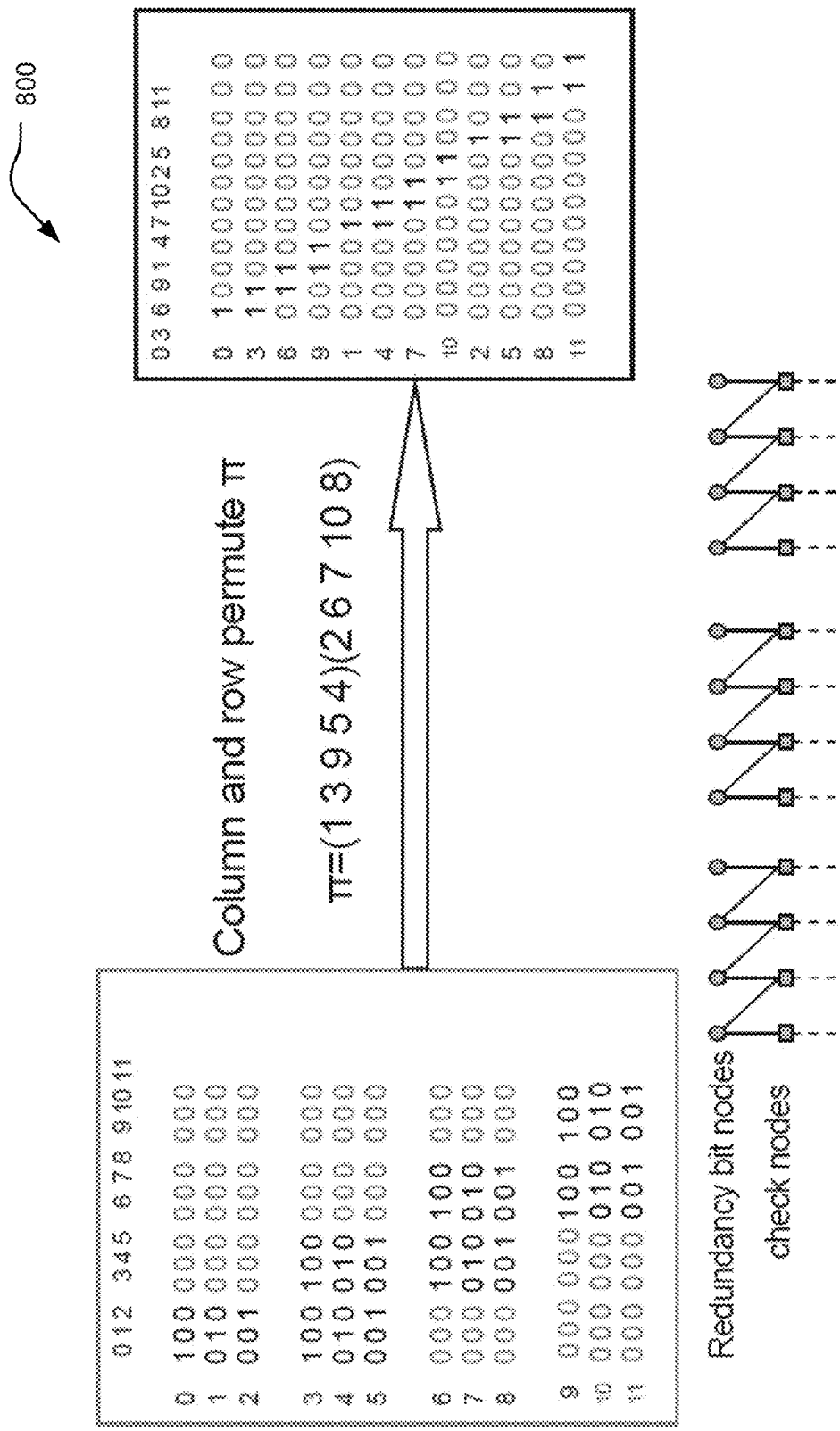
FIG. 8 illustrates an embodiment of a portion of an LDPC bipartite graph (or Tanner graph) of an LDPC code having a partial tree-like construction after row and/or column permutation.

FIG. 8 illustrates an embodiment 800 of a portion of an LDPC bipartite graph (or Tanner graph) of an LDPC code having a partial tree-like construction after row and/or column permutation.

Oftentimes performance diagrams are described in the context of BLER (Block Error Rate) [or BER (Bit Error Rate)] versus $E_b/N_o$ (ratio of energy per bit $E_b$ to the Spectral Noise Density $N_o$). This term $E_b/N_o$ is the measure of SNR (Signal to Noise Ratio) for a digital communication system. When looking at such performance curves, the BLER [or BER] may be determined for any given $E_b/N_o$ (or SNR) thereby providing a relatively concise representation of the performance of the decoding approach.

Figure 9:
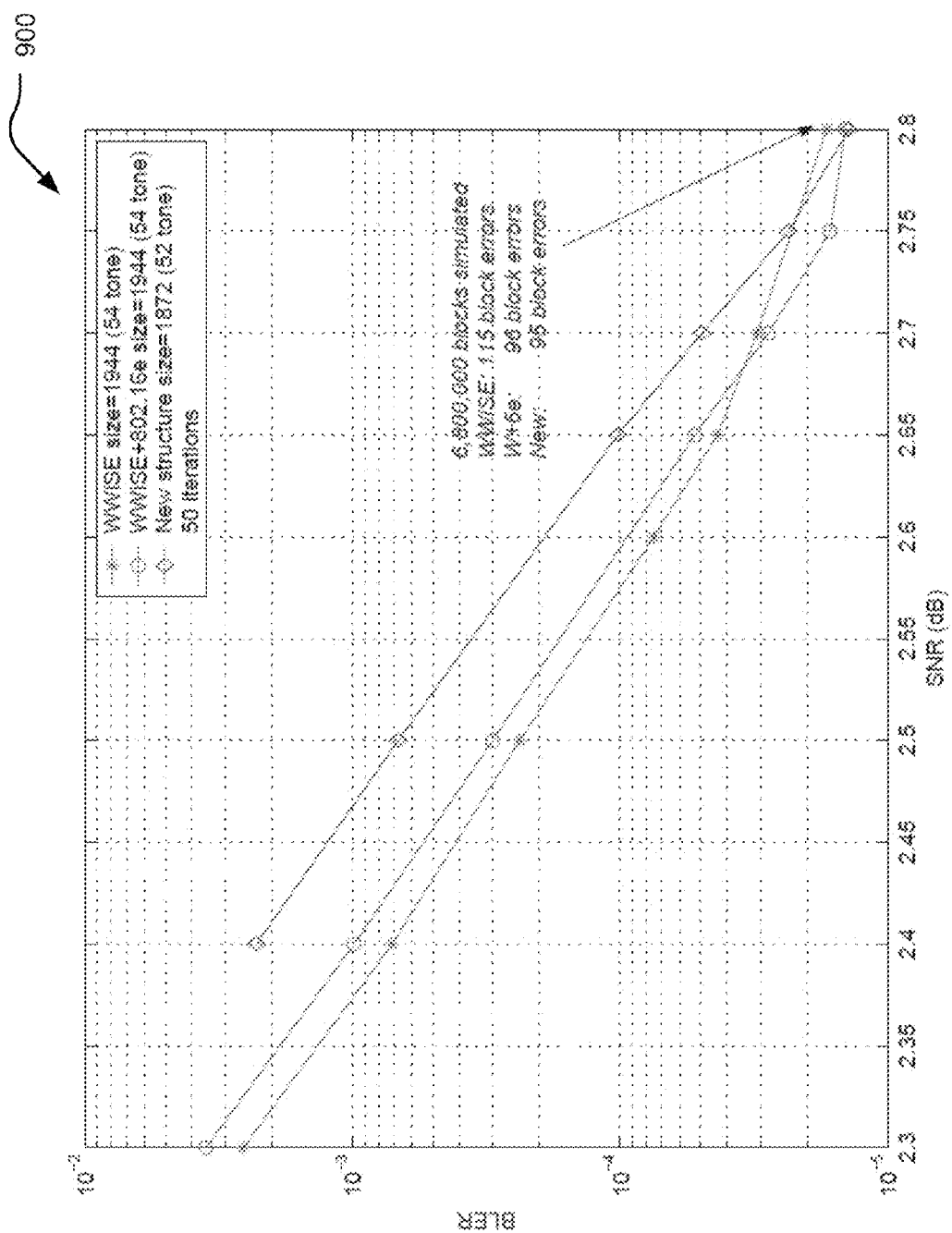
FIG. 9 shows a performance comparison among three types of LDPC codes, where WWISE code employs the Type 2 base matrix, WWISE+802.16e code employs the Type 3 base matrix, and the new code take the novel tree-like base matrix described herein.

FIG. 9 shows a performance comparison 900 among three types of LDPC codes, where WWISE code employs the Type 2 base matrix, WWISE+802.16e code employs the Type 3 base matrix, and the new code employs the novel tree-like base matrix described herein. As can be seen, the LDPC code employing the novel tree-like base matrix described herein has the better performance.

Referring back to the construction of an LDPC using the base matrix, B, in which the kind of LDPC code structure generated using (B,$\{P_{i,j}\}$), where B is the base matrix and $\{P_{i,j}\}$ is a set of binary sub-matrices therein, and in which the final LDPC parity check matrix, H, is obtained by replacing all of non-zero elements in the base matrix, B, by a sub-matrix (e.g., $\{P_{i,j}\}$) and by replacing all of zero elements in the base matrix, B, by an all-zero valued sub-matrix (e.g., all elements therein are '0').

Some examples of the corresponding size q sub-matrices (e.g., for different values of q) for the non-zero positions in the matrix $B_0$ (e.g., from $B=[B_1 B_0]$) are shown in FIG. 10.

FIG. 10 illustrates possible embodiments of the matrix, $B_0$, for the code rates of 1/2, 2/3, and 3/4, respectively.

Employing the structure of the matrix, $B_0$, as depicted herein is desirable for a number of reasons. For example, if provide for easy encoding (e.g., no reason to employ the "Richardson and Urbanke" method described in reference [4]). The simple back-substitution method can be employed. Moreover, employing the structure of the matrix, $B_0$, as such can lower the error floor due to the characteristics of the tree-like sub-graph. This is a structure that is different than that those employed in accordance with IEEE 802.16e and 802.11n.

Multiple options of designing an overall coding system are presented below.

Option 1

This option operates using the base matrix construction approach presented above to generate an LDPC parity check matrix, H. This approach, however, is tailored to employ one sub-matrix size for supporting a number of different code rates. Several LDPC codewords may be interleaved when employing higher order modulation types. Embodiments of the type of interleave that may be employed are depicted herein.

Using a baseline LDPC code, a set of different code rates is built there from based on one OFDM symbol having an associated QPSK modulation.

These LDPC codes are expanded to cover OFDM symbols having an associated modulation of 16 QAM or 64 QAM. Other modulation types can also be expanded to without departing from the scope and spirit of the invention.

This approach incurs no delay for transmission of OFDM symbols having the QPSK modulation. There is also a relatively fewer number of LDPC codes that need to be supported. However, a designer should consider whether any performance loss that is incurred at the higher ordered modulations (e.g., 16 QAM and 64 QAM) is acceptable for the desired application. For most applications, any performance loss that is incurred at the higher ordered modulations will be relatively small and probably within the design constraints of the system.

The base matrix, B (e.g., from $B=[B_1 B_0]$), employed for the following code rates has the form as follows:

Rate 1/2→B is a 12×24 binary matrix.
Rate 2/3→B is an 8×24 binary matrix.
Rate 3/4→B is a 6×24 binary matrix.

The sub-matrices employed therein are 28×28 permutation matrices (e.g., cyclic shifted identity sub-matrices).

The matrix, $B_0$ (e.g., from $B=[B_1 B_0]$), has the following form:

Rate 1/2→$B_0$ is a 12×12 binary matrix.
Rate 2/3→$B_0$ is an 8×8 binary matrix.
Rate 3/4→$B_0$ is a 6×6 binary matrix.

Figure 12:
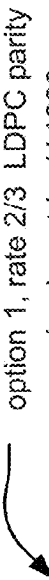

FIG. 11, FIG. 12, and FIG. 13 illustrate embodiments of various LDPC parity check matrices, H, shown by 1100, 1200, 1300, for the code rates of 1/2, 2/3, and 3/4, respectively.

In each of these diagrams, a "−" depicted within the LDPC parity check matrices, H, corresponds to a zero-valued sub-matrix (e.g., all elements in that sub-matrix are the value '0'). For the elements depicted within the LDPC parity check matrices, H, that have actual values (e.g., 23, 18, 0, etc.), this number corresponds to the cycle shifting an identity sub-matrix by that number (e.g., where I(k) stands for the permutation matrix obtained by right cyclic shifting the k columns (or the rows) of the q x q identity sub-matrix).

Figure 14:
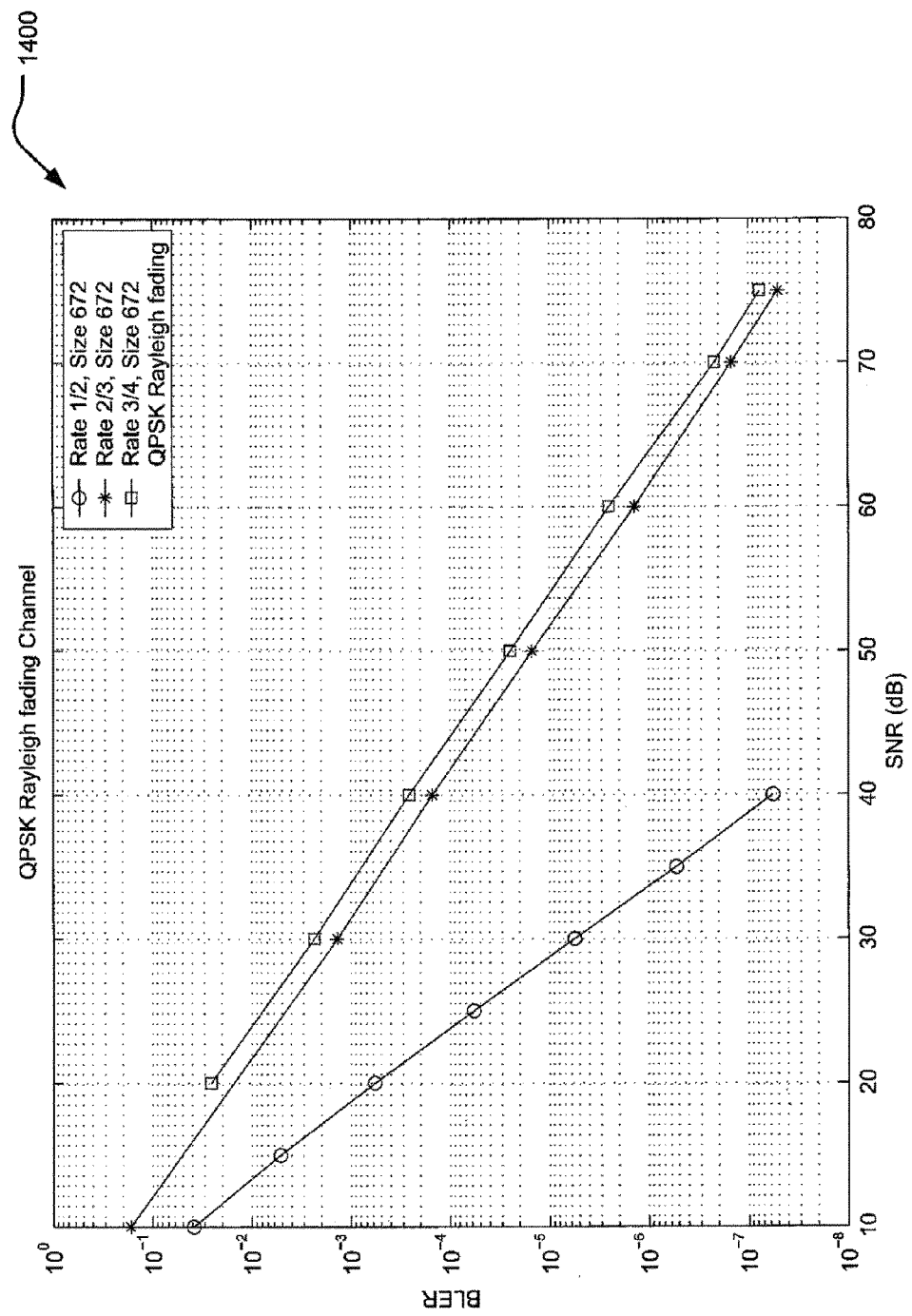
FIG. 14 shows a performance comparison among the three LDPC codes of Option 1, for code rates of 1/2, 2/3, and 3/4, based on a QPSK Rayleigh fading communication channel.

FIG. 14 shows a performance comparison 1400 among the three LDPC codes of Option 1, for code rates of 1/2, 2/3, and 3/4, based on a QPSK Rayleigh fading communication channel.

Figure 15:
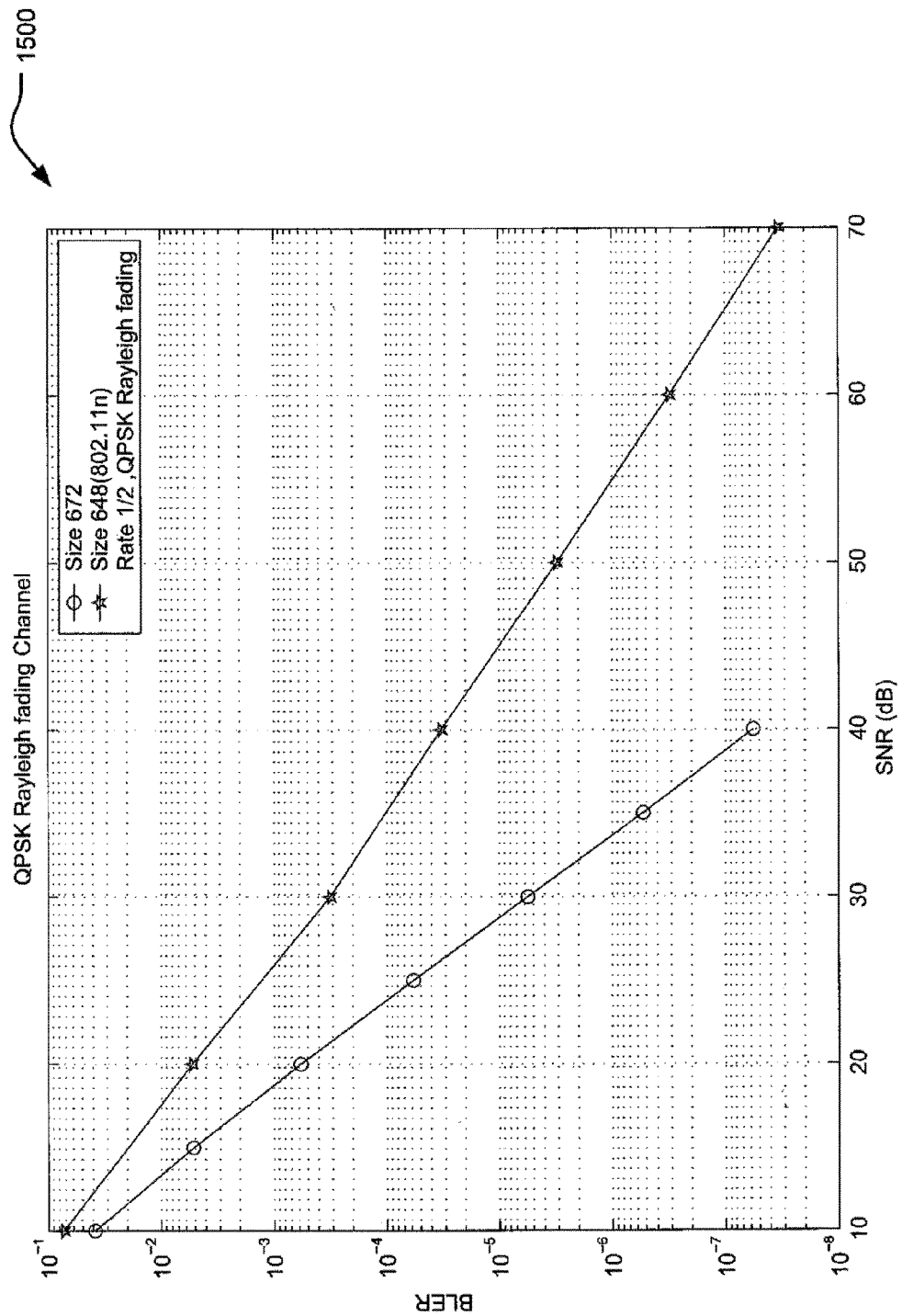
FIG. 15, FIG. 16, and FIG. 17 illustrate embodiments of performance comparisons among the three LDPC codes of Option 1, for code rates of 1/2, 2/3, and 3/4, based on a QPSK Rayleigh fading communication channel, as compared to the 802.11n codes.
Figure 16:
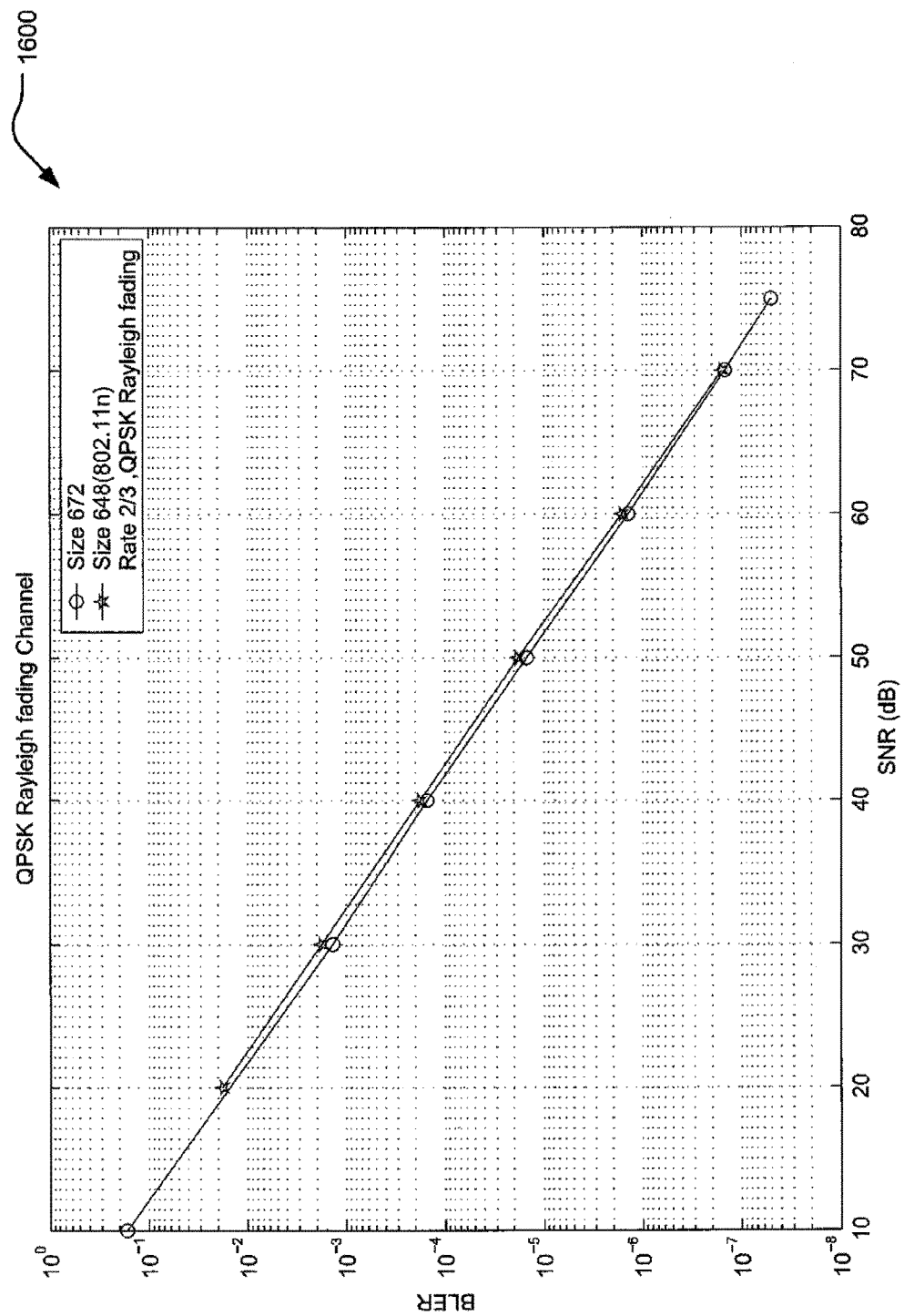
Figure 17:
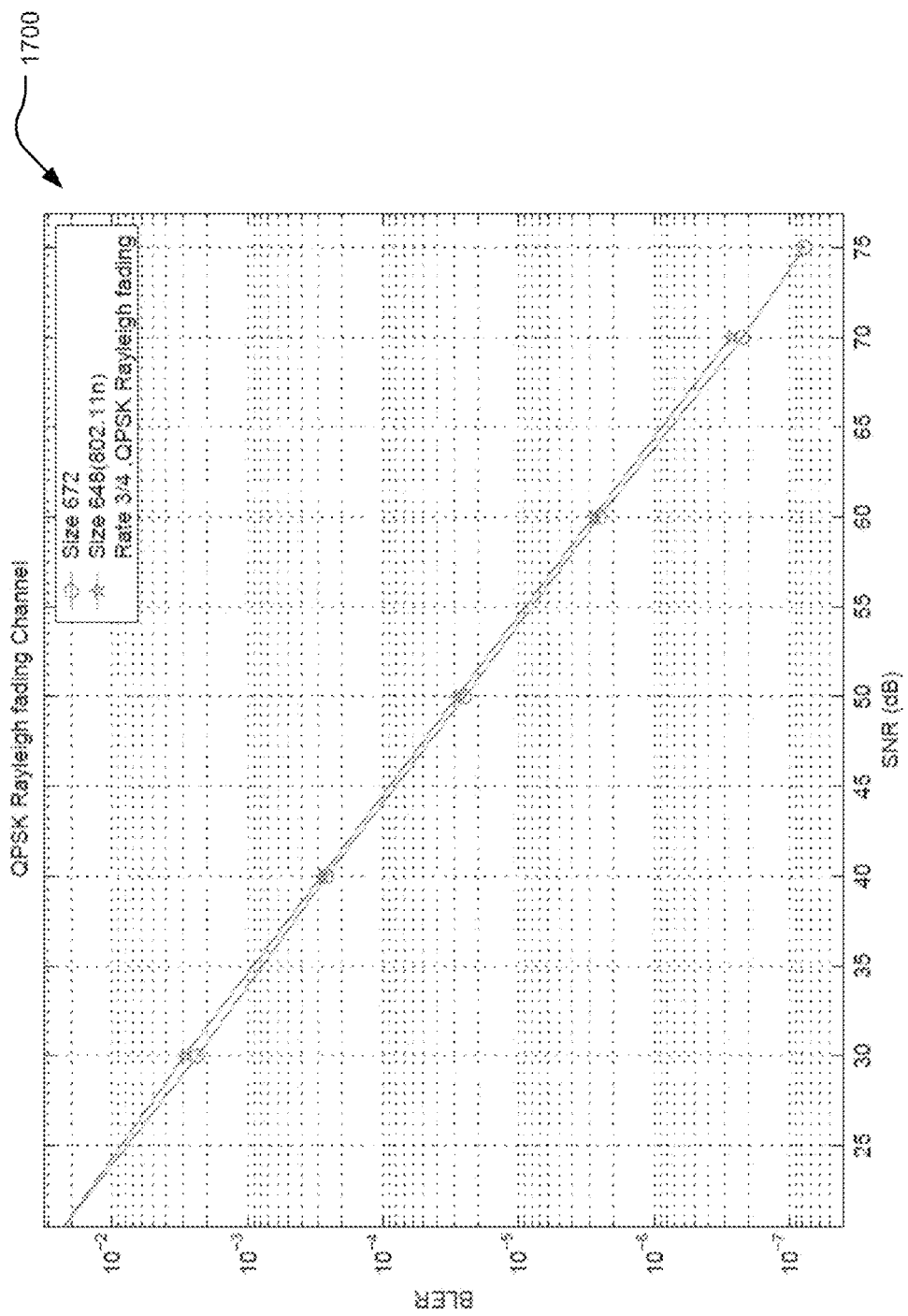

FIG. 15, FIG. 16, and FIG. 17 illustrate embodiments 1500, 1600, 1700, respectively, of performance comparisons among the three LDPC codes of Option 1, for code rates of 1/2, 2/3, and 3/4, based on a QPSK Rayleigh fading communication channel, as compared to the 802.11n codes.

QPSK Case:

Suppose an OFDM symbol has N sub-carriers, say $S_0, S_1, \ldots, S_{N-1}$ be N sub-carriers.

Case 1) one sub-carrier=one QPSK symbol (e.g., every sub-carrier has 2 bits).

Let $a_0, a_1, \ldots, a_{2N-1}$ be an LDPC codeword. Then, the interleave is as follows:

$$\begin{cases} M(a_{2k}) \rightarrow S_k \\ M(a_{2k+1}) \rightarrow S_{(k+N/2) \bmod N}, \end{cases}$$

k=0, 1, ..., N−1, where "→" may be understood as mapping the bits on the left hand side of the arrow to the symbol on the right hand side of the arrow.

16 QAM Case:

To expand the LDPC code construction approach of Option 1 to 16 QAM modulation, every modulation symbol includes 4 bits (as compared to only 2 bits each for a QPSK symbol).

In one embodiment, two separate LDPC codewords of size 672 bits are employed:

LDPC CW1: $a_0, a_1, \ldots, a_{n-1}$, where n=672 in this embodiment.

LDPC CW2: $b_0, b_1, \ldots, b_{n-1}$, where n=672 in this embodiment.

The interleave employed therein is as follows:

Step 1: write the codewords into the rows. For example first write in $a_0, a_1, \ldots, a_{n-1}$, and then write in $b_0, b_1, \ldots, b_{n-1}$.

Step 2: read the bits out via columns. For example, read out $a_0, b_0, a_1, b_1, a_2, b_2, \ldots, a_{n-1}, b_{n-1}$. The read out bits, $a_0, b_0, a_1, b_1, a_2, b_2, \ldots, a_{n-1}, b_{n-1}$, are then mapped to the 16 QAM constellation (whose constellation points therein have a particular mapping).

While this is just one possible interleave that may be employed, it is noted that other interleaves may alternatively be employed without departing from the scope and spirit of the invention.

For example, another possible interleave is described below. The interleaving process would begin by interleaving the LDPC codewords for an OFDM symbol.

Suppose an OFDM symbol has N sub-carriers, say $S_0, S_1, \ldots, S_{N-1}$ be N sub-carriers.

Case 2) one sub-carrier=one 16QAM symbol (e.g., every sub-carrier has 4 bits).

Let $a_0, a_1, \ldots, a_{2N-1}$ be a first LDPC codeword and let $b_0, b_1, \ldots, b_{2N-1}$ be a second LDPC codeword. Then, the interleave is as follows:

$$\begin{cases} M(a_{2k}) \rightarrow S_k \\ M(a_{2k+1}) \rightarrow S_{(k+N/2)modN} \\ M(b_{2k}) \rightarrow S_{(k+A)modN} \\ M(b_{2k+1}) \rightarrow S_{(k+A+N/2)modN}, \end{cases}$$

k=0, 1, . . . , N−1, where "→" may be understood as mapping the bits on the left hand side of the arrow to the symbol on the right hand side of the arrow.

The variable, A, can be any number. Some possible chosen values of A may be 1 or N/4, which may provide for greater frequency diversity.

Suppose a sub-carrier has 4 bits from the codewords, namely, $\bar{a}_0, \bar{a}_1$ from the first codeword and $\bar{b}_0, \bar{b}_1$ from the second codeword.

Then the map of these bits to in-phase and quadrature (I,Q) components of a 16 QAM symbol as follows:

$\bar{a}_0 \bar{b}_0 \rightarrow$ I with $\bar{a}_0$ for MSB (Most Significant Bit); and
$\bar{b}_1 \bar{a}_1 \rightarrow$ Q with $\bar{b}_1$ for MSB.

It is noted that the MSB for each of the in-phase and quadrature components are taken from different LDPC codewords.

Using this novel means by which the Option 1 (for LDPC code construction) can be expanded to accommodate the 16 QAM case, a performance comparison of this expanded codes is made to the 802.11n code.

Figure 18:
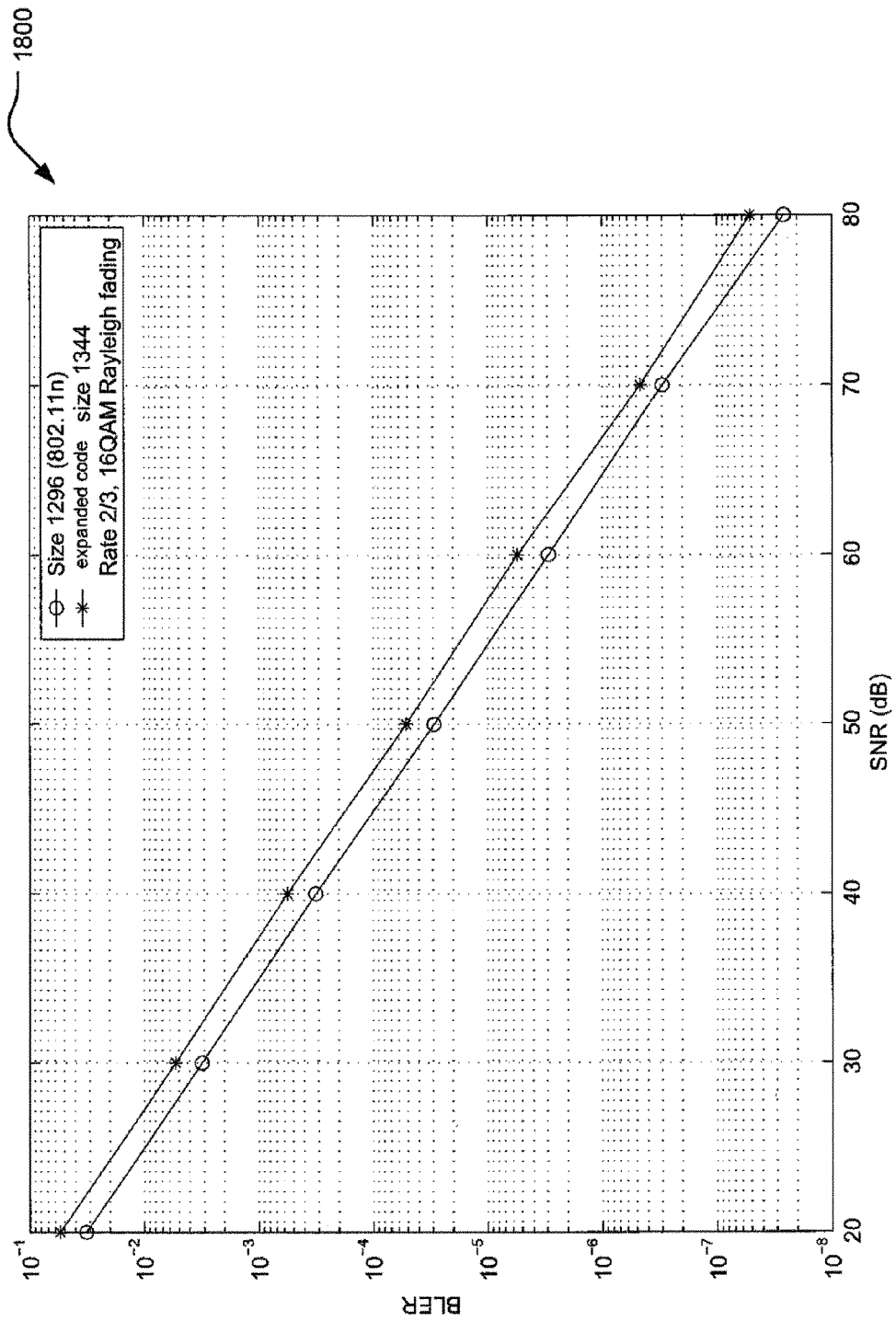
FIG. 18 illustrate embodiment of a performance comparison between the 802.11n code and the expanded code of code rate 2/3, employing a modulation of 16 QAM on a Rayleigh fading communication channel.

FIG. 18 illustrate embodiment 1800 of a performance comparison between the 802.11n code and the expanded code of code rate 2/3, employing a modulation of 16 QAM on a Rayleigh fading communication channel.

64 QAM Case:

To expand the LDPC code construction approach of Option 1 to 64 QAM modulation, every modulation symbol includes 6 bits (as compared to only 2 bits each for a QPSK symbol or even 4 bits for a 16 QAM symbol).

In one embodiment, three separate LDPC codewords of size 672 bits are employed:

LDPC CW1: $a_0, a_1, \ldots, a_{n-1}$, where n=672 in this embodiment.

LDPC CW2: $b_0, b_1, \ldots, b_{n-1}$, where n=672 in this embodiment.

LDPC CW3: $c_0, c_1, \ldots, c_{n-1}$, where n=672 in this embodiment.

The interleave employed therein is as follows:

Step 1: write the codewords into the rows. For example first write in $a_0, a_1, \ldots, a_{n-1}$, then write in $b_0, b_1, \ldots, b_{n-1}$, and then write in $c_0, c_1, \ldots, c_{n-1}$.

Step 2: read the bits out via columns. For example, read out $a_0, b_0, c_0, a_1, b_1, c_1, a_2, b_2, c_2, \ldots, a_{n-1}, b_{n-1}, c_{n-1}$. The read out bits, $a_0, b_0, c_0, a_1, b_1, c_1, a_2, b_2, c_2, \ldots, a_{n-1}, b_{n-1}, c_{n-1}$, are then mapped to the 64 QAM constellation (whose constellation points therein have a particular mapping).

While this is just one possible interleave that may be employed, it is noted that other interleaves may alternatively be employed without departing from the scope and spirit of the invention.

For example, another possible interleave is described below. The interleaving process would begin by interleaving the LDPC codewords for an OFDM symbol.

Suppose an OFDM symbol has N sub-carriers, say $S_0$, $S_1, \ldots, S_{N-1}$ be N sub-carriers.

Case 3) one sub-carrier=one 64 QAM symbol (e.g., every sub-carrier has 6 bits).

Let $a_0, a_1, \ldots, a_{2N-1}$ be a first LDPC codeword, let $b_0, b_1, \ldots, b_{2N-1}$ be a second LDPC codeword, and let $c_0, c_1, \ldots, c_{2N-1}$ be a third LDPC codeword. Then the interleave is as follows:

$$\begin{cases} M(a_{2k+1}) \rightarrow S_{(k+N/2)modN} \\ M(a_{2k+1}) \rightarrow S_{(k+N/2)modN} \\ M(b_{2k}) \rightarrow S_{(k+A)modN} \\ M(b_{2k+1}) \rightarrow S_{(k+A+N/2)modN} \\ M(c_{2k}) \rightarrow S_{(k+B)modN} \\ M(c_{2k+1}) \rightarrow S_{(k+B+N/2)modN}, \end{cases}$$

k=0, 1, . . . , N−1, where "→" may be understood as mapping the bits on the left hand side of the arrow to the symbol on the right hand side of the arrow.

The variable A and B can be any numbers

Some possible chosen values of A and B may be:

A=1, and B=2; or

A=N/6, and B=N/6, which may provide for greater frequency diversity.

To map the 6 interleaved coded bits to a 64 QAM symbol, respectively, the following may be performed:

Suppose a sub-carrier has 6 bits from codewords, namely, $\bar{a}_0, \bar{a}_1$ from the first codeword, $\bar{b}_0, \bar{b}_1$ from the second codeword, and $\bar{c}_0, \bar{c}_1$ from the third codeword.

Then the map of these bits to in-phase and quadrature (I,Q) components of a 64 QAM symbol as follows:

$\bar{a}_0 \bar{b}_0 \bar{c}_0 \rightarrow$ I with $\bar{a}_0$ for MSB; and
$\bar{b}_1 \bar{c}_1 \bar{a}_1 \rightarrow$ Q with $\bar{b}_1$ for MSB.

It is noted that the MSB for each of the in-phase and quadrature components are taken from different LDPC codewords. If the MSB for the in-phase component of the symbol is taken from the first LDPC codeword, then the MSB for the quadrature component of the symbol is taken from the second LDPC codeword or the third LDPC codeword. Moreover, it can be seen that the positions of each of the in-phase and quadrature components are taken from different LDPC codewords (e.g., MSB from first codeword, middle-SB from second codeword, LSB from third codeword or MSB from second codeword, middle-SB from third codeword, LSB from first codeword, or another combination, etc.).

Using this novel means by which the Option 1 (for LDPC code construction) can be expanded to accommodate the 64 QAM case, a performance comparison of this expanded codes is made to the 802.11n code.

Figure 19:
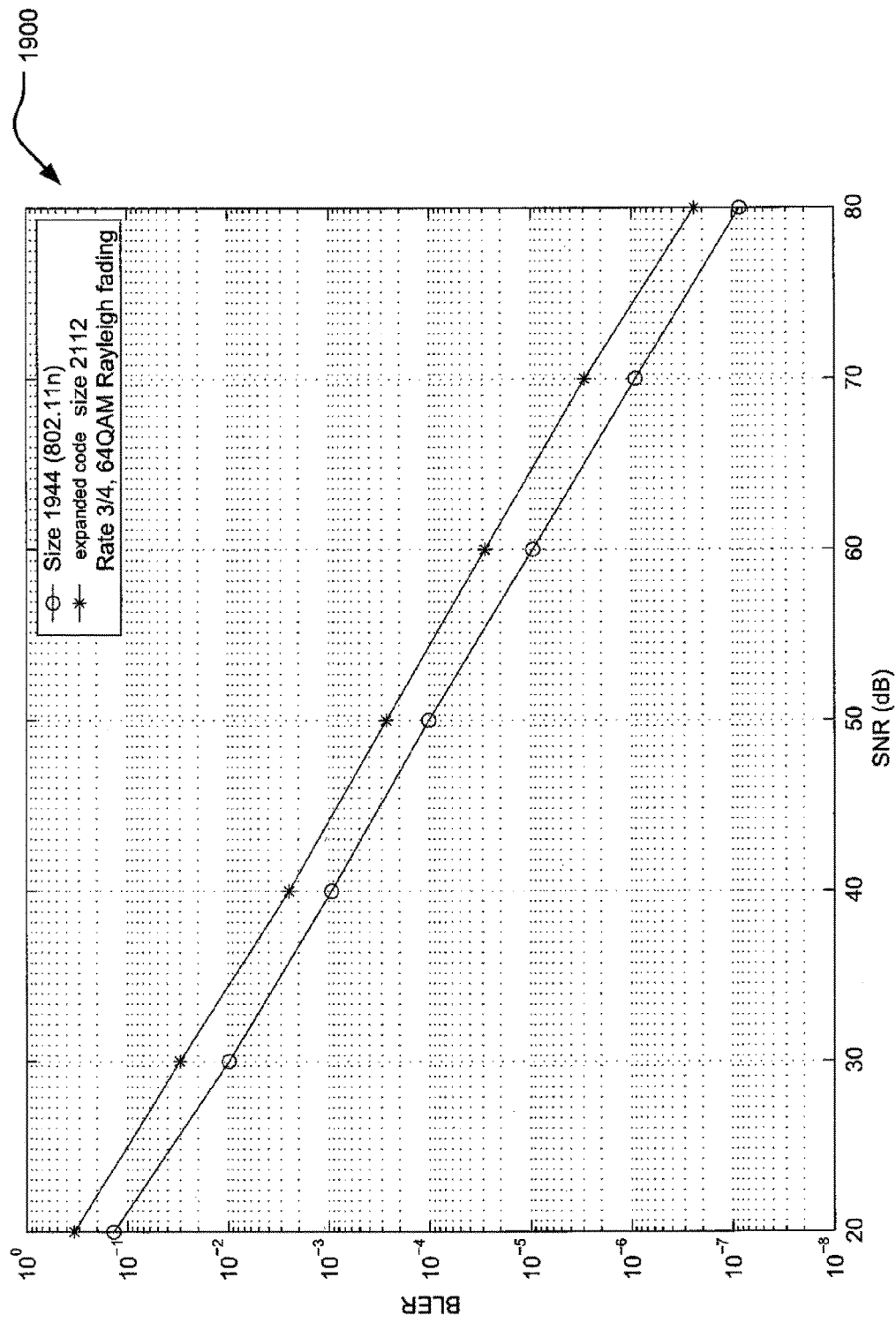
FIG. 19 illustrate embodiment of a performance comparison between the 802.11n code and the expanded code of code rate 3/4, employing a modulation of 64 QAM on a Rayleigh fading communication channel.

FIG. 19 illustrate embodiment 1900 of a performance comparison between the 802.11n code and the expanded code of code rate 3/4, employing a modulation of 64 QAM on a Rayleigh fading communication channel.

Option 2

This option operates using the base matrix construction approach presented above to generate an LDPC parity check matrix, H. In this approach, using a baseline LDPC code, a set of different code rates is built there from based on one OFDM symbol having an associated 64 QAM modulation.

This design approach may be viewed as being relatively opposite to Option 1, in which a single code is built based on one OFDM symbol having an associated QPSK modulation, and that code is expanded to generate the codes for 16 QAM modulation and 64 QAM modulation.

In contrast, here, a single code is built based on one OFDM symbol having an associated 64 QAM modulation, and that code is then pared back to generate the codes for QPSK modulation and 16 QAM modulation.

Clearly, the one code can be pared back to other modulation types without departing from the scope and spirit of the invention.

Again, a single code is built based on one OFDM symbol having an associated 64 QAM modulation. One code is employed for 3 OFDM symbols when using the QPSK modulation, and two codes are employed for 3 OFDM symbols when using the 16 QAM modulation.

This is based on finding the least common multiple of the number of bits employed in accordance with the single code built based on one OFDM symbol having an associated 64 QAM modulation (e.g., that employs 6 bits).

For example, QPSK includes 2 bits per OFDM symbol, so 3 OFDM symbols may be employed to form 6 bits to comport with the single code built based on one OFDM symbol having an associated 64 QAM modulation (e.g., that employs 6 bits).

However, 16 QAM includes 4 bits per OFDM symbol, so 2 OFDM symbols employed would yield 8 bits (e.g., which does not comport with the 6 bits employed in accordance with 64 QAM modulation, which employs 6 bits). However, since 16 QAM includes 4 bits per OFDM symbol, 3 OFDM symbols may be employed to form 12 bits to comport with two separate codes built based on two OFDM symbol having an associated 64 QAM modulation (e.g., that employ 6 bits each for a total of 12 bits).

This approach inherently employs longer LDPC codes, which thereby provide for better error correcting capability. Moreover, a relatively fewer number of LDPC codes need to be supported.

However, a designer should consider that there may be a delay incurred when employed QPSK modulation and/or 16 QAM modulation. For example, if the number of transmitted OFDM symbols having QPSK modulation and/or 16 QAM modulation are not a multiple of 3, then shortening and/or puncturing may be appropriately used.

The same base matrix, B, type construction may be employed as described above.

The base matrix, B (e.g., from B=[$B_1 B_0$], and having size 42), employed for the following code rates has the form as follows. In addition, one sub-matrix size may be employed to support all different code rates (e.g., of size 48).

Rate 1/2→B is a 21×42 binary matrix.
Rate 2/3→B is an 14×42 binary matrix.
Rate 0.76→B is a 10×42 binary matrix.

The sub-matrices employed therein are 48×48 permutation matrices (e.g., cyclic shifted identity sub-matrices).

The matrix, $B_0$ (e.g., from B=[$B_1 B_0$]), has the following form:

Rate 1/2→$B_0$ is a 21×21 binary matrix.
Rate 2/3→$B_0$ is an 14×14 binary matrix.
Rate 0.76→$B_0$ is a 10×10 binary matrix.

The sub-matrix size may alternatively be 72, 96, or some other size without departing from the scope and spirit of the invention.

Option 3

This option operates using the base matrix construction approach presented above to generate a number of LDPC parity check matrices, $H_1$, $H_2$, $H_3$, etc. to support all of the different modulations. For example, one set of different code rate LDPC codes are constructed for one modulation (e.g., 3 sets of LDPC codes for 3 different modulations such as QPSK, 16 QAM, and 64 QAM). Clearly, more than 3 sets may be employed, and more than 3 types of modulations may be employed without departing from the scope and spirit of the invention.

The rates may not be the same for the different modulations. For example, three code rates (e.g., 1/2, 2/3, and 3/4) for QPSK modulation and 16 QAM modulation, respectively, but for two code rates (e.g., 2/3 and 3/4) for 64 QAM modulation.

This approach inherently employs a larger number of LDPC codes, and therefore each LDPC code is particularly tailored for its particular application. This may provide for better coding gain and provide better coverage across all of the applications. However, because more LDPC codes need to be supported, there may be more hardware complexity.

Suppose one OFDM symbol has S sub-carriers, then the size of the various LDPC codes may be as follows:
Size 2S LDPC codes for QPSK (e.g., 672=2×336).
Size 4S LDPC codes for 16 QAM (e.g., 1344=4×336).
Size 6S LDPC codes for 64 QAM (e.g., 2016=6×336).

As with other embodiments, a single sub-matrix size may be employed for all of the codes (e.g., size 48).

Alternatively, different sized sub-matrices may e employed for all of the various codes (e.g., use 3 different sub-matrix sizes for 3 different LDPC codes). In this situation, the sub-matrix sizes may be proportion, such as follows:
Size 28=1×28 for a code of size 672 for QPSK (e.g., 672=2×336).
Size 56=2×28 for a code of size 1344 for 16 QAM (e.g., 1344=4×336).
Size 84=3×28 for a code of size 2016 for 64 QAM (e.g., 2016=6×336).

A similar LDPC code structure (e.g., as having the partial tree-like structure) can be employed in this embodiment (e.g., Option 3), as well as for Option 1 and Option 2.

Figure 20:
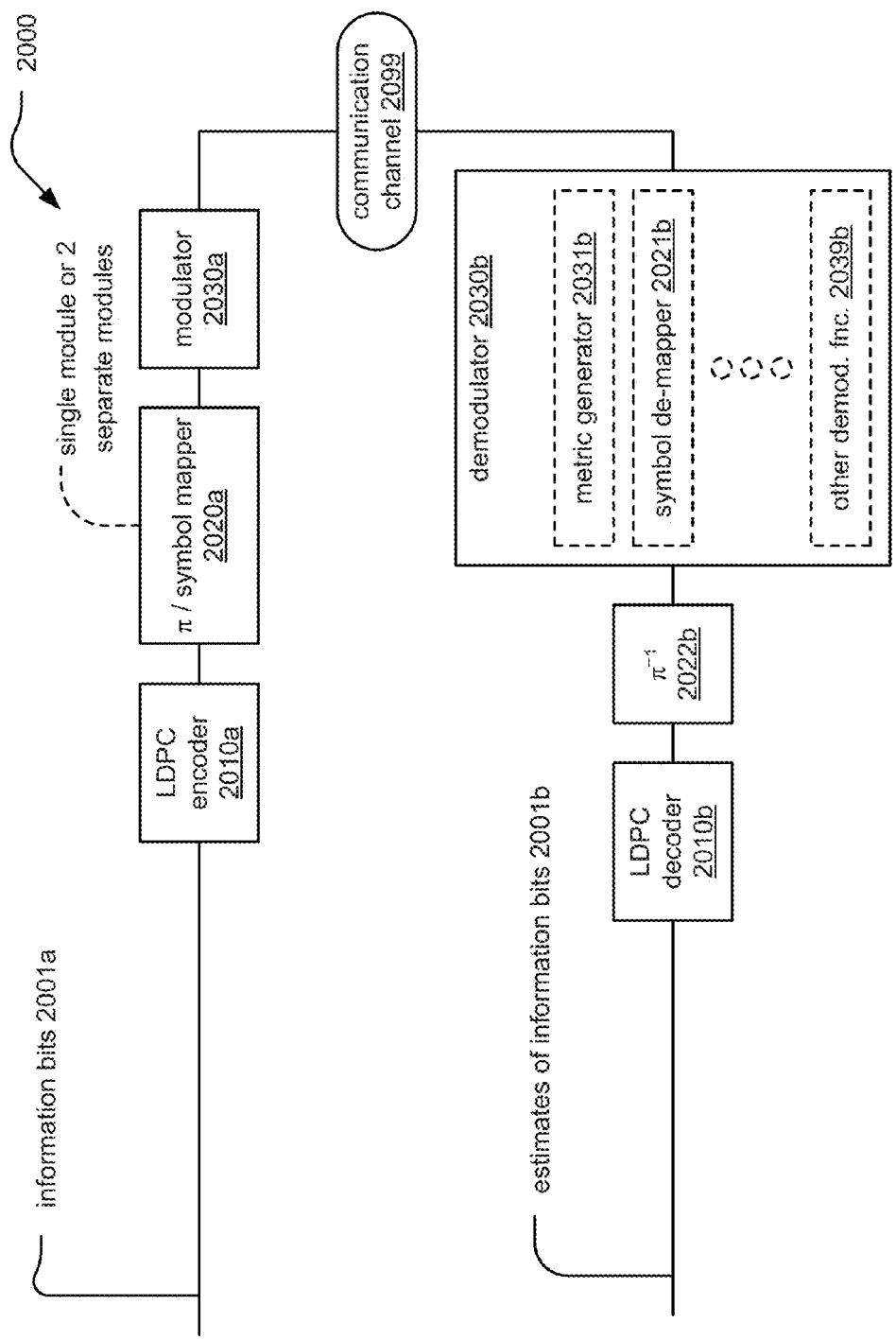
FIG. 20 and FIG. 21 illustrate alternative embodiments of a communication system.
Figure 21:
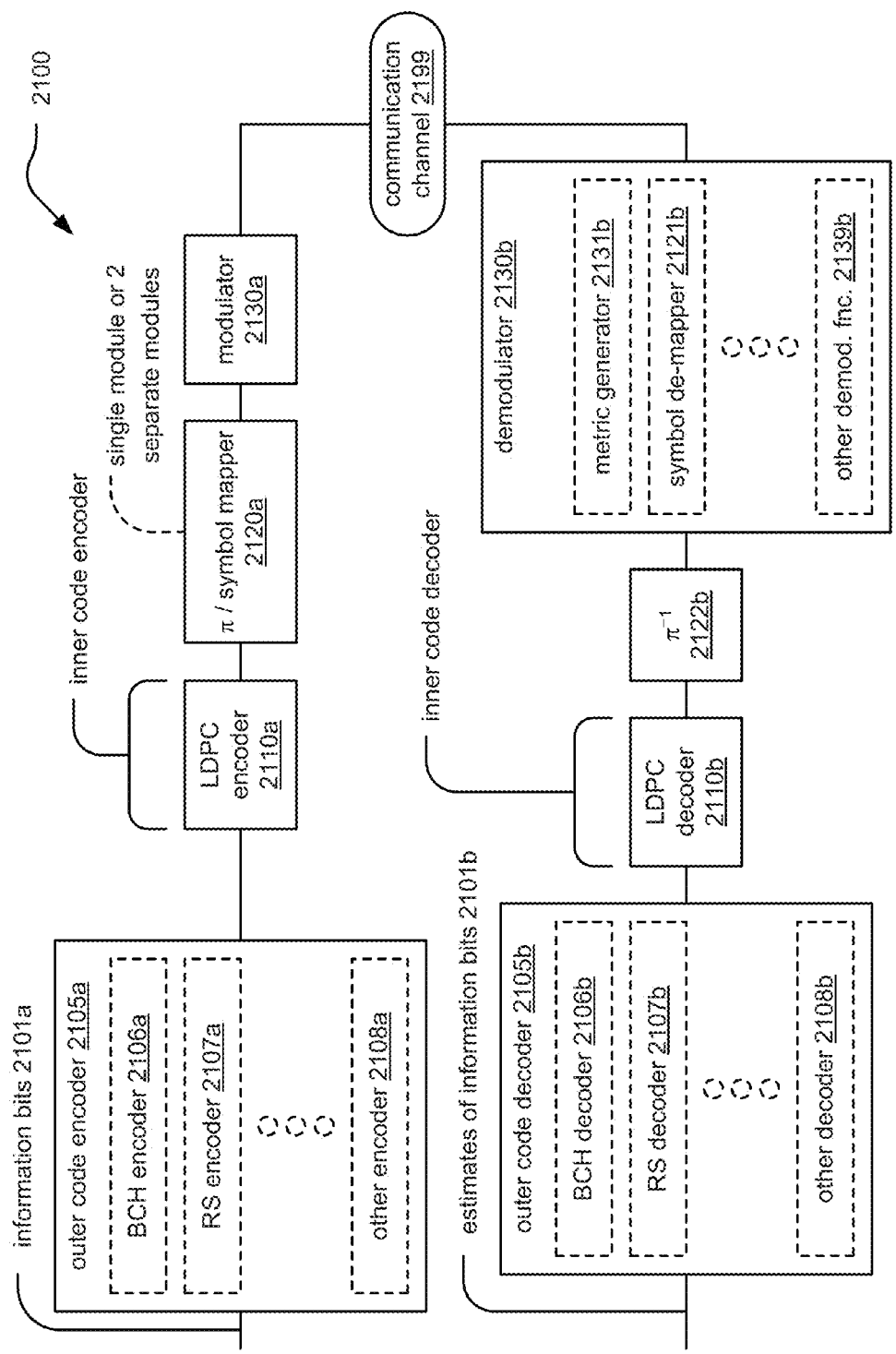

FIG. 20 and FIG. 21 illustrate alternative embodiments of a communication system 2000 and 2100, respectively.

Referring to the communication system 2000 of FIG. 20, information bits 2001a are provided to an LDPC encoder 2010a from which at least one LDPC codeword is output. This one or more LDPC codewords is provided to an interleaver ($\pi$)/symbol mapper 2020a implemented to perform any desired combination of interleaving and symbol mapping including those various combination provided herein. This interleaver ($\pi$)/symbol mapper 2020a may be viewed as performing sub-carrier interleaving (e.g., in an OFDM embodiment) and subsequent symbol mapping of the bit labels assigned to respective sub-carriers within an available spectrum. The interleaver ($\pi$)/symbol mapper 2020a may be implemented as a single circuitry, module, etc. or it may alternatively be implemented using two separate circuitries, modules, etc. (e.g., a separate interleaver ($\pi$) and a separate symbol mapper) without departing from the scope and spirit of the invention.

It is noted that the operational characteristics of the LDPC encoder 2010a in combination with the interleaver ($\pi$)/symbol mapper 2020a can be performed with any combination described herein (e.g., by expanding an LDPC code, that is constructed for QPSK modulation, to accommodate 16 QAM modulation and 64 QAM modulation based on code rate or other considerations; employing a code constructed for 64 QAM modulation and modifying it to accommodate QPSK modulation and 16 QAM modulation; having different LDPC codes for each separate LDPC code/modulation combination; selecting MSB bits from different LDPC codewords; etc.).

A modulator 2030a performs any necessary modification to the discrete sequence of symbols output from the interleaver ($\pi$)/symbol mapper 2020a to generate a signal that comports with the characteristics of communication channel 2099 (e.g., including filtering, digital to analog conversion, frequency conversion, gain adjustment, etc.).

A demodulator 2030b receives the signal from the communication channel 2099 (e.g., the signal may have incurred certain effects including noise, etc.) and perform demodulation thereon. This may involve the calculation of certain metrics (e.g., by a metric generator 2031b) and symbol de-mapping (e.g., by a symbol de-mapper 2021b) for use in subsequent decoding. This may also involve any other demodulation function (e.g., as shown by reference numeral 2039b) including filtering, analog to digital conversion, frequency conversion, gain adjustment, etc.

After undergoing the demodulation operations, the bit sequence generated there from undergoes de-interleaving in de-interleaver ($\pi^{-1}$) 2022b. An LDPC decoder 2010b then decodes the output from the de-interleaver ($\pi^{-1}$) 2022b to generate estimates of the information bits 2001b.

Referring to the communication system 2100 of FIG. 21, this has some similarities to the previous embodiment, with at least one difference being that an outer code and an inner code are both employed therein.

Initially, information bits 2101a are provided to an outer code encoder 2105a. The outer code encoder 2105a may be implemented using any of a desired variety of codes including a BCH code (as invented independently by (1) Hocquenghem and by (2) Bose and Ray-Chaudhuri—which may generally be referred to as a BCH (Bose, Ray-Chaudhuri, Hocquenghem) code), a RS (Reed-Solomon) code, or any other desired code employed in accordance with error correction coding. For example, the outer code encoder 2105a may be implemented as a BCH encoder 2106a. Alternatively, the outer code encoder 2105a may be implemented as a RS encoder 2107a. Generally, the outer code encoder 2105a may be implemented as any other encoder 2108a.

The encoded bits output from the outer encoder (regardless of which outer encoder is employed in a particular embodiment), are provided to an LDPC encoder 2110a from which at least one LDPC codeword is output. This one or more LDPC codewords is provided to an interleaver ($\pi$)/symbol mapper 2120a implemented to perform any desired combination of interleaving and symbol mapping including those various combination provided herein. This interleaver ($\pi$)/symbol mapper 2120a may be viewed as performing sub-carrier interleaving (e.g., in an OFDM embodiment) and subsequent symbol mapping of the bit labels assigned to respective sub-carriers within an available spectrum. The interleaver ($\pi$)/symbol mapper 2120a may be implemented as a single circuitry, module, etc. or it may alternatively be implemented using two separate circuitries, modules, etc. (e.g., a separate interleaver ($\pi$) and a separate symbol mapper) without departing from the scope and spirit of the invention.

It is noted that the operational characteristics of the LDPC encoder 2110a in combination with the interleaver ($\pi$)/symbol mapper 2120a can be performed with any combination described herein (e.g., by expanding an LDPC code, that is constructed for QPSK modulation, to accommodate 16 QAM modulation and 64 QAM modulation based on code rate or other considerations; employing a code constructed for 64 QAM modulation and modifying it to accommodate QPSK modulation and 16 QAM modulation; having different LDPC codes for each separate LDPC code/modulation combination; selecting MSB bits from different LDPC codewords; etc.).

A modulator 2130a performs any necessary modification to the discrete sequence of symbols output from the interleaver ($\pi$)/symbol mapper 2120a to generate a signal that comports with the characteristics of communication channel 2199 (e.g., including filtering, digital to analog conversion, frequency conversion, gain adjustment, etc.).

A demodulator 2130b receives the signal from the communication channel 2199 (e.g., the signal may have incurred certain effects including noise, etc.) and perform demodulation thereon. This may involve the calculation of certain metrics (e.g., by a metric generator 2131b) and symbol de-mapping (e.g., by a symbol de-mapper 2121b) for use in subsequent decoding. This may also involve any other demodulation function (e.g., as shown by reference numeral 2139b) including filtering, analog to digital conversion, frequency conversion, gain adjustment, etc.

After undergoing the demodulation operations, the bit sequence generated there from undergoes de-interleaving in de-interleaver ($\pi^{-1}$) 2122b. An LDPC decoder 2110b then decodes the output from the de-interleaver ($\pi^{-1}$) 2122b to generate a sequence of estimated bits that subsequently undergo outer decoding in outer decoder 2105b from which estimates of the information bits 2101b are generated.

Similarly as the outer code encoder 2105a may be implemented using a variety of codes including a BCH code, a RS (Reed-Solomon) code, or any other desired code employed in accordance with error correction coding, the outer code decoder 2105b will be chosen to correspond to the type of code employed within the outer code encoder 2105a.

For example, if the outer code encoder 2105a is implemented as a BCH encoder 2106a, then the outer code decoder 2105b is implemented as a BCH decoder 2106b. Alternatively, the outer code encoder 2105a is implemented as a RS encoder 2107a, then the outer code decoder 2105b is implemented as a RD decoder 2107b. Generally, if the outer code encoder 2105a is implemented as other encoder 2108a, then the outer code decoder 2105b is implemented as other decoder 2108b (e.g., which employs the same code as other encoder 2108a).

Figure 22:
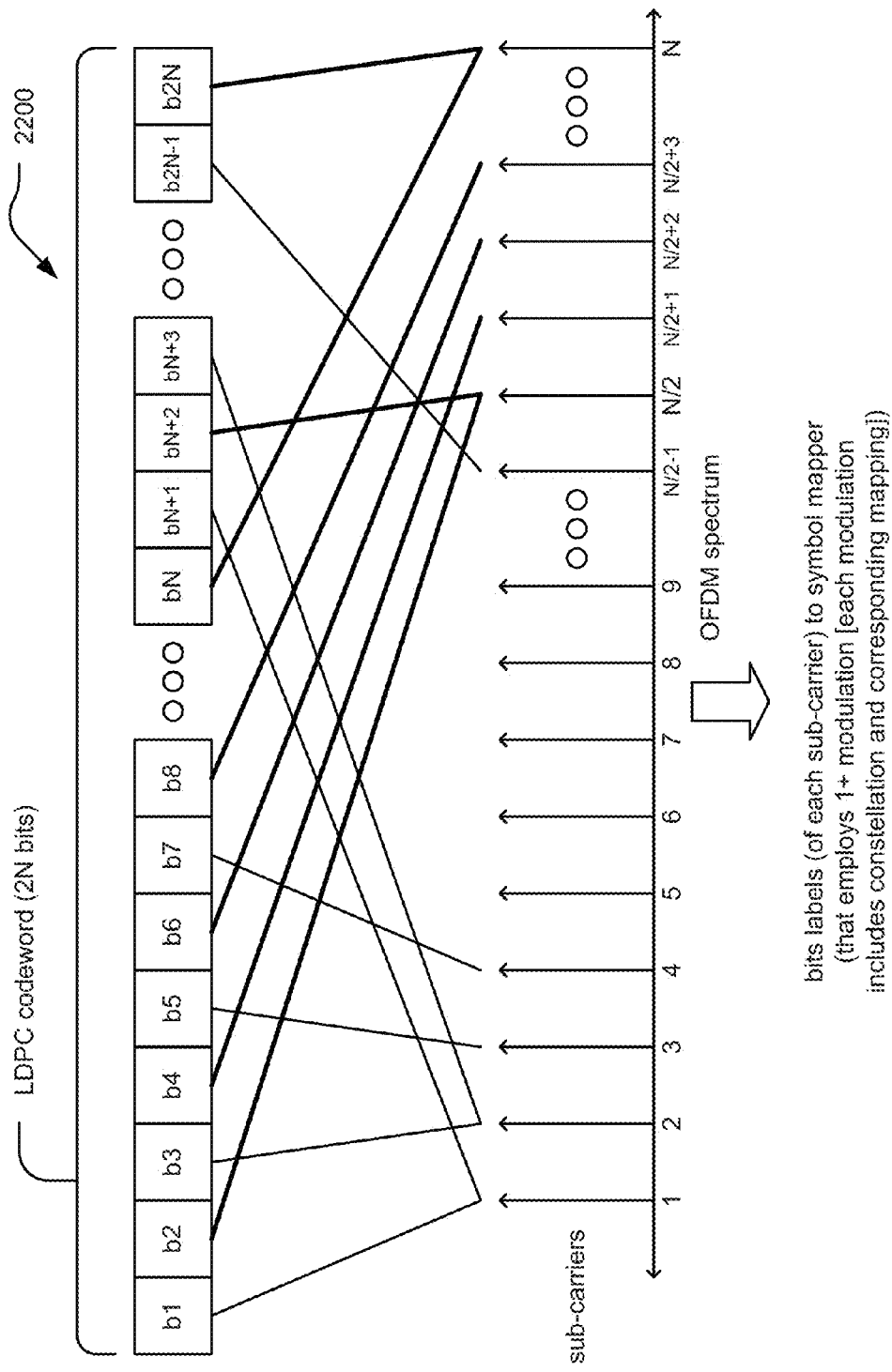
FIG. 22 illustrates an embodiment of sub-carrier interleaving.

FIG. 22 illustrates an embodiment 2200 of sub-carrier interleaving. In this diagram, an LDPC codeword is shown as including 2N bits, where N is an integer. In accordance with LDPC encoding, information bits undergo LDPC encoding to generate an LDPC codeword (alternatively, referred to as LDPC coded bits). In accordance with sub-carrier interleaving, the bits of the LDPC codeword are assigned to orthogonal signals within an orthogonal signaling scheme. For example, in accordance with an orthogonal frequency division multiplexing (OFDM) signaling scheme, which is a type of frequency division multiplexing signaling, a number of closely spaced orthogonal sub-carriers are employ to carry data via a communication channel. For example, data is divided into several parallel data channels such that one corresponds to each sub-carrier.

In this embodiment, the bits of the LDPC codeword are separated as much as possible in frequency (e.g., across the various sub-carriers of the OFDM spectrum). In this example, an LDPC codeword including 2N bits is sub-carrier interleaved across N sub-carriers within an available spectrum. As such, 2 bits are assigned to each sub-carrier.

For example, the even located bits (e.g., b1, b3, b4, etc.) are assigned to the sub-carriers 1, 2, 3, etc. The odd located bits (e.g., b2, b4, b6, etc.) are assigned to the sub-carriers N/2, N/2+1, N/2+2, etc. The even located bits correspond to the sub-carriers starting at the beginning of the available sub-carriers of the available OFDM spectrum. The odd located bits correspond to the sub-carriers starting at a mid-point among the available sub-carriers of the available OFDM spectrum.

In this diagram, the offset associated with the odd located bits odd located bits (e.g., b2, b4, b6, etc.) corresponds to one half of the available OFDM spectrum. Other embodiments may alternatively include offsets that are different.

As can be seen in this diagram, there are 2 bits that are assigned to each sub-carrier in accordance with the sub-carrier interleaving. Such 2 bit labels then may undergo symbol mapping, as performed by a symbol mapper, may appropriately undergo symbol mapping using a quadrature phase shift keying (QPSK) type modulation. It is noted that each bit label (e.g., being 2 bits in this diagram) may be symbol mapped using more than one modulation (e.g., various QPSK modulations have different constellation shapes in which the 4 constellation points are located, and the constellation mapping may be different among different constellations, including those having identical constellation shapes).

Figure 23:
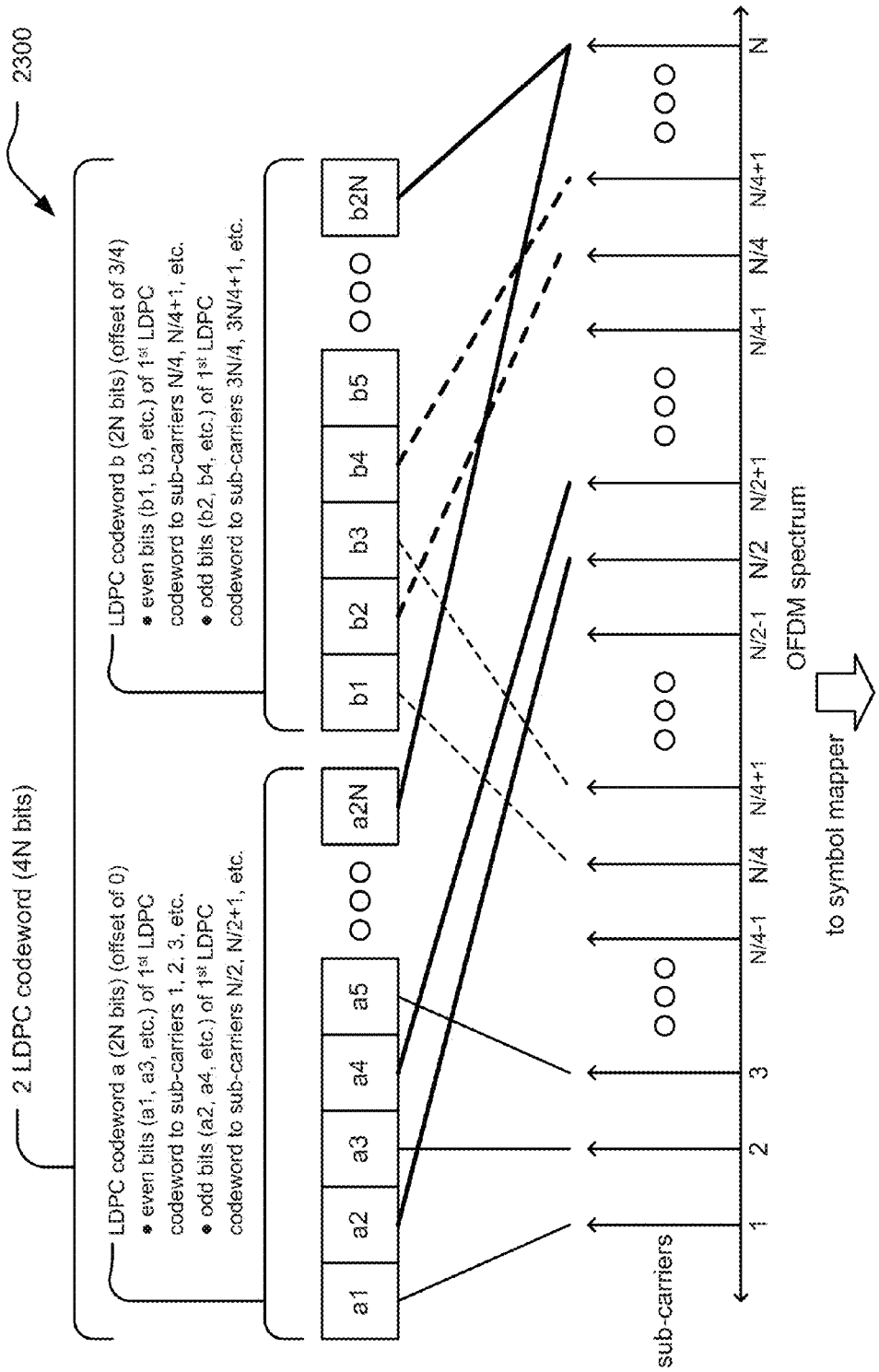
FIG. 23 and FIG. 24 illustrate alternative embodiments of sub-carrier interleaving.
Figure 24:
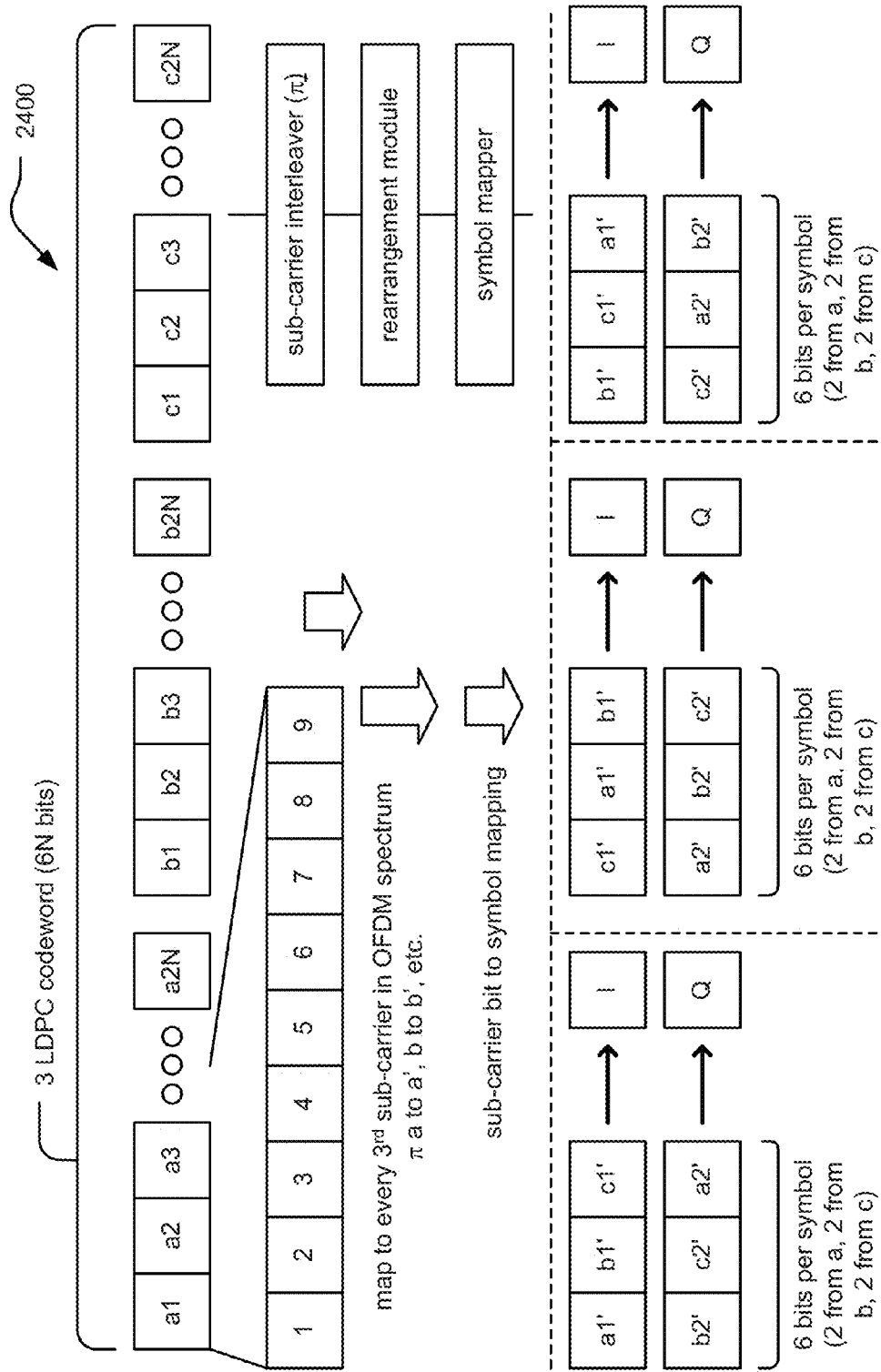

FIG. 23 and FIG. 24 illustrate alternative embodiments of sub-carrier interleaving.

Referring to embodiment 2300 of FIG. 23, in this diagram, two separate LDPC codewords are shown as including a total of 4N bits, where N is an integer. Each of the 2 LDPC codewords are shown are including 2N bits each.

Again, in accordance with LDPC encoding, information bits undergo LDPC encoding to generate an LDPC codeword (alternatively, referred to as LDPC coded bits). In accordance with sub-carrier interleaving, the bits of these 2 LDPC codewords are assigned to orthogonal signals within an orthogonal signaling scheme. In accordance with an OFDM signaling scheme, this total of 4N bits are sub-carrier interleaved among N available sub-carriers of the OFDM spectrum. As such, 4 bits are assigned to each sub-carrier.

The even located bits from the first LDPC codeword (e.g., a1, a3, a5, etc.) are assigned to the sub-carriers 1, 2, 3, etc. The odd located bits from the first LDPC codeword (e.g., a2, a4, a5, etc.) are assigned to the sub-carriers N/2, N/2+1, N/2+2, etc. The even located bits of the first LDPC codeword correspond to the sub-carriers starting at the beginning of the available sub-carriers of the available OFDM spectrum. The odd located bits of the first LDPC codeword correspond to the sub-carriers starting at a mid-point among the available sub-carriers of the available OFDM spectrum.

The bits of the second LDPC codeword are sub-carrier interleaved in accordance with an offset, shown as corresponding to 1/4 of the number of sub-carriers in this diagram. For comparison, the bits of the first LDPC codeword may be viewed as being sub-carrier interleaved in accordance with an offset of zero. The even located bits from the second LDPC codeword (e.g., b1, b3, b5, etc.) are assigned to the sub-carriers N/4, N/4+1, N/4+2, etc. The odd located bits from the second LDPC codeword (e.g., b2, b4, b5, etc.) are assigned to the sub-carriers 3N/4, 3N/4+1, 3N/4+2, etc. The even located bits of the second LDPC codeword correspond to the sub-carriers starting at an offset location among the available sub-carriers of the available OFDM spectrum (e.g., 1/4 of the number of sub-carriers in this embodiment). The odd located bits of the second LDPC codeword correspond to the sub-carriers starting at second offset location among the available sub-carriers of the available OFDM spectrum (e.g., 3/4 of the number of sub-carriers in this embodiment).

As can be seen in this diagram, there are 4 bits that are assigned to each sub-carrier in accordance with the sub-carrier interleaving. Such 4 bit labels then may undergo symbol mapping, as performed by a symbol mapper, may appropriately undergo symbol mapping using a 16 quadrature amplitude modulation (16 QAM) type modulation. Again, it is noted that each bit label (e.g., being 4 bits in this diagram) may be symbol mapped using more than one modulation (e.g., various 16 QAM modulations have different constellation shapes in which the 16 constellation points are located, and the constellation mapping may be different among different constellations, including those having identical constellation shapes).

Referring to embodiment 2400 of FIG. 24, in this diagram, two separate LDPC codewords are shown as including a total of 6N bits, where N is an integer. Each of the 3 LDPC codewords are shown are including 2N bits each. Considering the example of OFDM (among other orthogonal signaling schemes), in accordance with an OFDM signaling scheme, this total of 6N bits are sub-carrier interleaved among N available sub-carriers of the OFDM spectrum. As such, 6 bits are assigned to each sub-carrier.

The even located bits from the first LDPC codeword (e.g., a1, a3, a5, etc.) are assigned to the sub-carriers 1, 2, 3, etc. The odd located bits from the first LDPC codeword (e.g., a2, a4, a5, etc.) are assigned to the sub-carriers N/2, N/2+1, N/2+2, etc. The even located bits of the first LDPC codeword correspond to the sub-carriers starting at the beginning of the available sub-carriers of the available OFDM spectrum. The odd located bits of the first LDPC codeword correspond to the sub-carriers starting at a mid-point among the available sub-carriers of the available OFDM spectrum.

The bits of the second LDPC codeword are sub-carrier interleaved in accordance with an offset (e.g., corresponding to 1/4) of the number of sub-carriers in this diagram. For comparison, the bits of the first LDPC codeword may be viewed as being sub-carrier interleaved in accordance with an offset of zero. The even located bits from the second LDPC codeword (e.g., b1, b3, b5, etc.) are assigned to the sub-carriers N/4, N/4+1, N/4+2, etc. The odd located bits from the second LDPC codeword (e.g., b2, b4, b5, etc.) are assigned to the sub-carriers 3N/4, 3N/4+1, 3N/4+2, etc. The even located bits of the second LDPC codeword correspond to the sub-carriers starting at an offset location among the available sub-carriers of the available OFDM spectrum (e.g., 1/4 of the number of sub-carriers in this embodiment). The odd located bits of the second LDPC codeword correspond to the sub-carriers starting at second offset location among the available sub-carriers of the available OFDM spectrum (e.g., 3/4 of the number of sub-carriers in this embodiment).

The bits of the third LDPC codeword are sub-carrier interleaved in accordance with an offset (e.g., corresponding to 3/4) of the number of sub-carriers in this diagram. The even located bits from the second LDPC codeword (e.g., c1, c3, c5, etc.) are assigned to the sub-carriers N/8, N/8+1, N/8+2, etc. The odd located bits from the second LDPC codeword (e.g., c2, c4, c5, etc.) are assigned to the sub-carriers 5N/8, 5N/8+1, 5N/8+2, etc. The even located bits of the second LDPC codeword correspond to the sub-carriers starting at an offset location among the available sub-carriers of the available OFDM spectrum (e.g., 1/8 of the number of sub-carriers in this embodiment). The odd located bits of the second LDPC codeword correspond to the sub-carriers starting at second offset location among the available sub-carriers of the available OFDM spectrum (e.g., 5/8 of the number of sub-carriers in this embodiment).

It is note that while certain specific offsets (e.g., 0, 1/8, 1/4, 1/2, 3/4, etc.) are described herein, it is also noted that any desired offsets may be employed in any number of embodiments, including those that include one LDPC codeword, multiple LDPC codeword, etc. Moreover, the various aspects of sub-carrier interleaving may be applied to any desired group of bits including non-encoded bits, encoded bits generated in accordance with any number of other types of error correction codes (ECCs) (e.g., Reed-Solomon (RS), BCH, turbo coding, trellis coding, etc.).

Moreover, at the bottom of this diagram, it is noted that manipulation, re-ordering, and/or rearrangement of the bits assigned to various sub-carriers may also be emplaced appropriately to ensure that most significant bits (MSBs), middle significant bits (2SBs), and most significant bits (LSBs) may be arranged so that bits from various LDPC codewords are not resident as MSBs within adjacent symbols.

For example, the notation is the diagram shows a0', b0', c0', a1', b1', c1' as corresponding to the bits assigned to the various sub-carriers (i.e., the bits from the respective sub-carriers of the OFDM spectrum that have already undergone sub-carrier interleaving and are then to undergo symbol mapping). This notation in the diagram corresponds to the "bar" related notation employed above and elsewhere herein.

For example, considering an embodiment in which 6 bits are assigned to every $3^{rd}$ sub-carrier, then the bits assigned to the sub-carriers 1, 4, 7, etc. are shown as:

a1', b1', c1'→I with a bit from $1^{st}$ LDPC codeword (a codeword) for MSB;

b2', c2', a2'→Q with a bit from $2^{nd}$ LDPC codeword (b codeword) for MSB.

The bits assigned to the sub-carriers 2, 5, 6, etc. are shown as:

c1', a1', b1'→I with a bit from $3^{rd}$ LDPC codeword (c codeword) for MSB;

a2', b2', c2'→Q with a bit from $1^{st}$ LDPC codeword (a codeword) for MSB.

The bits assigned to the sub-carriers 2, 5, 6, etc. are shown as:

b1', c1', a1'→I with a bit from $2^{nd}$ LDPC codeword (b codeword) for MSB;

c2', a2', b2'→Q with a bit from $3^{rd}$ LDPC codeword (c codeword) for MSB.

Clearly, a similar type of manipulation, re-ordering, and/or rearrangement of the bits assigned to various sub-carriers may also be emplaced appropriately to ensure that MSBs are appropriately selected from various of the LDPC codewords. The reader will understand that such manipulation, re-ordering, and/or rearrangement of the bits may be made for 16 QAM, etc. and other higher order modulations as well.

This manipulation, re-ordering, and/or rearrangement of the bits assigned to various sub-carriers may being emplaced in accordance with the principles described above may be extended to any of the various embodiments described herein (e.g., be they QPSK, 16 QAM, 64 QAM, 32 QAM, etc.).

It is also noted that the sub-carrier interleaver module and the symbol mapper may be implemented using separate hardware, circuitries, etc. On the right hand side of the diagram of FIG. 24, it can be seen that a rearrangement module may be implemented between such a sub-carrier interleaver module and the symbol mapper to effectuate any desired sub-carrier interleaver module and the symbol mapper in accordance with the principles described herein.

Figure 25:
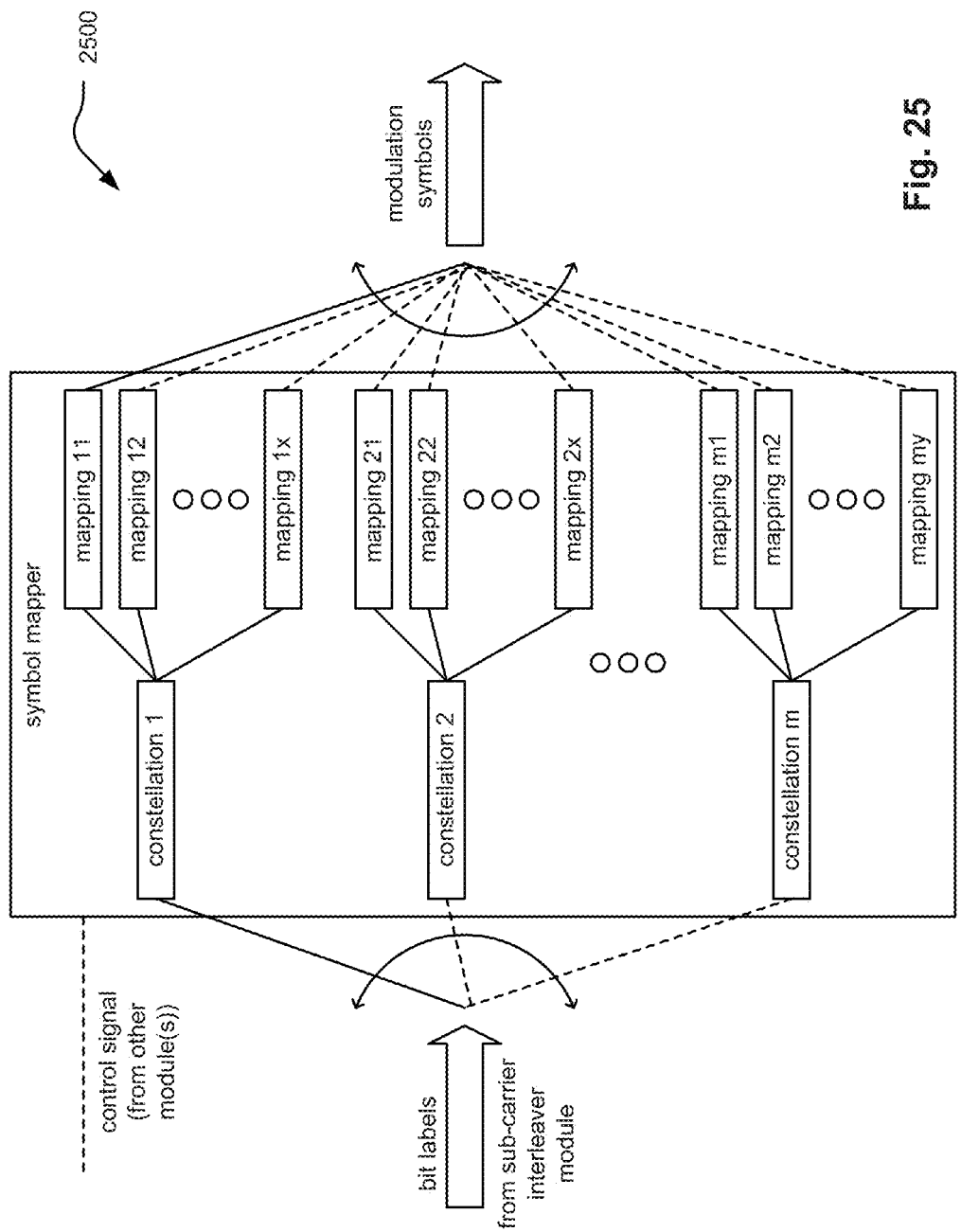
FIG. 25 illustrates an embodiment of symbol mapping.

FIG. 25 illustrates an embodiment of symbol mapping. The bit labels that outcome from the sub-carrier interleaving undergo symbol mapping, such as within a symbol mapper, in accordance with one or more modulation. Each modulation includes a constellation and a mapping of the constellation points therein. Also, a single constellation type (e.g., having a given number of constellation points and a given shape/arrangement of those constellation points) may have more than one mapping of those constellation points that may be adaptively changed as a function of time. For example, a first bit label may be symbol mapped to constellation 1 having mapping 11 at time 1, and second bit label may be symbol mapped to constellation 1 having mapping 21 at time 2.

In some embodiments, the symbol mapper switches among various modulations in accordance with a predetermined sequence/pattern. It is also noted that a control signal, from one or more other modules, may be provided from to the symbol mapper to direct the adaptive switching among various modulations employed by the symbol mapper (e.g., based on signal to noise ratio (SNR) of a com channel, operating conditions, etc.).

While certain examples of modulations are described herein (e.g., QPSK, 16 QAM, 64 QAM, etc.), however, the principles and aspects related to the invention as presented herein, may be applied to any types of modulations (e.g., 8 PSK, 32 QAM, higher order of QAM, and/or others etc.).

FIG. 26A illustrates an embodiment of a method for performing transmit processing.

Referring to method 2600 of FIG. 26A, the method 2600 begins by performing outer code encoding of information bits, as shown in a block 2610. The method 2600 continues by performing inner-code encoding of outer code encoded information bits, as shown in a block 2620. The method 2600 then operates by performing orthogonal signaling interleaving of inner/outer encoded bits, as shown in a block 2630.

The method 2600 continues by modulating orthogonal signal interleaved, inner/outer encoded bits thereby generating modulation symbols, as shown in a block 2640. The method 2600 continues by processing modulation symbols thereby generating a continuous time signal, as shown in a block 2650. The method 2600 then operates by launching continuous time signal into communication channel, as shown in a block 2660.

FIG. 26B illustrates an alternative embodiment of a method for performing transmit processing.

Referring to method 2601 of FIG. 26B, the method 2601 begins by LDPC encoding of information bits thereby generating LDPC codewords, as shown in a block 2611. The method 2601 then operates by performing sub-carrier interleaving of bits of LDPC codewords into sub-carriers of OFDM spectrum, as shown in a block 2621. The method 2601 continues by assigning labels from sub-carriers of OFDM spectrum to bit labels for symbol mapping, as shown in a block 2631.

The method 2601 then operates by symbol mapping bit labels to one or more modulations (each modulation having a constellation with associated mapping of constellation points therein) thereby generating modulation symbols, as shown in a block 2641. The method 2600 continues by processing modulation symbols thereby generating a continuous time signal, as shown in a block 2651. The method 2600 then operates by launching continuous time signal into communication channel, as shown in a block 2661.

It is noted that the various modules (e.g., encoding modules, decoding modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

References

[1] R. Gallager, *Low-Density Parity-Check Codes*, Cambridge, Mass.: MIT Press, 1963.

[2] R. G. Gallager, "Low density parity check codes," *IRE Trans. Info. Theory*, vol. IT-8, January 1962, pp. 21-28.

[3] M. G. Luby, M. Mitzenmacher, M. A. Shokrollahi, D. A. Spielman, and V. Stemann, "Practical Loss-Resilient Codes," *Proc. 29$^{th}$ Symp. on Theory of Computing*, 1997, pp. 150-159.

[4] T. J. Richardson and R. L. Urbanke, "The capacity of low-density parity-check code under message-passing decoding," *IEEE Trans. Inform. Theory*, Vol. 47, No. 2, February 2001, pp. 599-618.

[5] ETSI EN 302 307, V1.1.2 (2006-06), "Digital Video Broadcasting (DVB); Second generation framing structure, channel coding and modulation system for Broadcasting, Interactive Services, News Gathering and other broadband satellite applications," 74 pages.

[6] IEEE P802.11n™/D1.0, "IEEE P802.11n™/D1.0 Draft Amendment to STANDARD [FOR] Information Technology-Telecommunications and information exchange between systems-Local and Metropolitan networks-Specific requirements-Part 11: Wireless LAN Medium Access Control (MAC) and Physical Layer (PHY) specifications: Enhancements for Higher Throughput," March 2006, 335 pages.

[7] IEEE Std 802.16e-2005, "IEEE Standard for Local and metropolitan area networks; Part 16: Air Interface for Fixed and Mobile Broadband Wireless Access Systems; Amendment 2: Physical and Medium Access Control Layers for Combined Fixed and Mobile Operation in Licensed Bands and Corrigendum 1," 864 pages.

[8] Niclas Wiberg (1996), "*Codes and Decoding on General Graphs*," Unpublished doctoral dissertation, University of Linkoping, Sweden, 108 pages.

What is claimed is:

1. An apparatus, comprising:
an LDPC (Low Density Parity Check) encoder to encode a plurality of bits to generate at least one LDPC codeword;
a sub-carrier interleaver module, coupled to the LDPC encoder, to assign bits of the at least one LDPC codeword to a plurality of sub-carriers within an orthogonal frequency division multiplexing (OFDM) spectrum to generate a plurality of bit labels such that each of the plurality of bit labels corresponds to one of the plurality of sub-carriers and adjacent bits of the at least one LDPC codeword are maximally separated among the plurality of sub-carriers within the OFDM spectrum;
a symbol mapper module, coupled to the sub-carrier interleaver module, to map the plurality of bit labels to a plurality of modulations to generate a plurality of modulation symbols; and
a modulator to process the plurality of modulation symbols to generate a continuous time signal that is launched into a communication channel.

2. The apparatus of claim 1, further comprising:
a BCH (Bose, Ray-Chaudhuri, Hocquenghem) code) encoder, coupled to the LDPC encoder, to encode a plurality of information bits to generate the plurality of bits that undergo encoder by the LDPC encoder.

3. The apparatus of claim 1, wherein:
a Reed-Solomon (RS) encoder, coupled to the LDPC encoder, to encode a plurality of information bits to generate the plurality of bits that undergo encoder by the LDPC encoder.

4. The apparatus of claim 1, further comprising:
a rearrangement module, interposed between the sub-carrier interleaver module and the symbol mapper module, to change an order of bits within at least one of the plurality of bit labels output from the sub-carrier interleaver module and subsequently provided to the symbol mapper module.

5. The apparatus of claim 1, wherein:
the LDPC encoder to encode the plurality of bits to generate a plurality of LDPC codewords; and
the sub-carrier interleaver module assigns at least one bit from each of the plurality of LDPC codewords to each of the plurality of sub-carriers.

6. The apparatus of claim 1, wherein:
the sub-carrier interleaver module to assign at least two bits from the at least one LDPC codeword to each of the plurality of sub-carriers.

7. The apparatus of claim 1, wherein:
a bipartite graph corresponding to an LDPC code employed by the LDPC encoder has a partial tree-like graph structure; and
an LDPC matrix corresponding to the LDPC code includes a plurality of CSI (Cyclic Shifted Identity) sub-matrices and a plurality of all-zero valued sub-matrices.

8. The apparatus of claim 1, wherein:
a first of the plurality of modulations includes a first constellation with a first mapping of constellation points therein; and
a second of the plurality of modulations includes a second constellation with a second mapping of constellation points therein.

9. The apparatus of claim 1, wherein:
a first of the plurality of modulations includes a constellation with a first mapping of constellation points therein; and
a second of the plurality of modulations includes the constellation with a second mapping of constellation points therein.

10. The apparatus of claim 1, wherein:
the apparatus is a communication device; and
the communication device is implemented within at least one of a satellite communication system, a wireless communication system, a wired communication system, and a fiber-optic communication system.

11. An apparatus, comprising:
a BCH (Bose, Ray-Chaudhuri, Hocquenghem) code) encoder to encode a plurality of information bits to generate a plurality of BCH coded bits;
an LDPC (Low Density Parity Check) encoder, coupled to the BCH encoder, to encode a plurality of BCH coded bits to generate at least one LDPC codeword;
a sub-carrier interleaver module, coupled to the LDPC encoder, to assign bits of the at least one LDPC codeword to a plurality of sub-carriers within an orthogonal frequency division multiplexing (OFDM) spectrum to generate a plurality of bit labels such that each of the plurality of bit labels corresponds to one of the plurality of sub-carriers and adjacent bits of the at least one LDPC codeword are maximally separated among the plurality of sub-carriers within the OFDM spectrum;
a rearrangement module, coupled to the sub-carrier interleaver module, to change an order of bits within at least one of the plurality of bit labels to generate a plurality of rearranged bit labels;
a symbol mapper module, coupled to the rearrangement module, to map the plurality of rearranged bit labels to a plurality of modulations to generate a plurality of modulation symbols; and
a modulator that processes the plurality of modulation symbols to generate a continuous time signal that is launched into a communication channel.

12. The apparatus of claim 11, wherein:
the LDPC encoder to encode the plurality of bits to generate a plurality of LDPC codewords; and
the sub-carrier interleaver module to assign at least one bit from each of the plurality of LDPC codewords to each of the plurality of sub-carriers.

13. The apparatus of claim 11, wherein:
the sub-carrier interleaver module to assign at least two bits from the at least one LDPC codeword to each of the plurality of sub-carriers.

14. The apparatus of claim 11, wherein:
a bipartite graph corresponding to an LDPC code employed by the LDPC encoder has a partial tree-like graph structure; and
an LDPC matrix corresponding to the LDPC code includes a plurality of CSI (Cyclic Shifted Identity) sub-matrices and a plurality of all-zero valued sub-matrices.

15. The apparatus of claim 11, wherein:
the apparatus is a communication device; and
the communication device is implemented within at least one of a satellite communication system, a wireless communication system, a wired communication system, and a fiber-optic communication system.

16. A method, comprising:
employing an LDPC (Low Density Parity Check) encoder to encode a plurality of bits thereby generating at least one LDPC codeword;
assigning bits of the at least one LDPC codeword to a plurality of sub-carriers within an orthogonal frequency division multiplexing (OFDM) spectrum thereby generating a plurality of bit labels such that each of the plurality of bit labels corresponds to one of the plurality of sub-carriers and adjacent bits of the at least one LDPC codeword are maximally separated among the plurality of sub-carriers within the OFDM spectrum;
performing symbol mapping of the plurality of bit labels to a plurality of modulations thereby generating a plurality of modulation symbols; and
processing the plurality of modulation symbols thereby generating a continuous time signal that is launched into a communication channel; and wherein:
a bipartite graph corresponding to an LDPC code employed by the LDPC encoder has a partial tree-like graph structure; and
an LDPC matrix corresponding to the LDPC code includes a plurality of CSI (Cyclic Shifted Identity) sub-matrices and a plurality of all-zero valued sub-matrices.

17. The method of claim 16, further comprising:
before performing the symbol mapping of the plurality of bit labels, changing an order of bits within at least one of the plurality of bit labels.

18. The method of claim 16, further comprising:
employing the LDPC encoder to encode the plurality of bits thereby generating a plurality of LDPC codewords; and
assigning at least one bit from each of the plurality of LDPC codewords to each of the plurality of sub-carriers.

19. The method of claim 16, further comprising:
assigning at least two bits from the at least one LDPC codeword to each of the plurality of sub-carriers.

20. The method of claim 16, wherein:
the method is performed within a communication device; and
the communication device is implemented within at least one of a satellite communication system, a wireless communication system, a wired communication system, and a fiber-optic communication system.

* * * * *

UNITED STATES PATENT AND TRADEMARK OFFICE
CERTIFICATE OF CORRECTION

PATENT NO.        : 8,392,786 B2
APPLICATION NO.   : 12/435821
DATED             : March 5, 2013
INVENTOR(S)       : Jason A. Trachewsky et al.

It is certified that error appears in the above-identified patent and that said Letters Patent is hereby corrected as shown below:

In the Claims

Col. 26, line 28, in claim 2: after "Hocquenghem" delete ")"
Col. 27, line 16, in claim 11: after "Hocquenghem" delete ")"

Signed and Sealed this
Twenty-fourth Day of December, 2013

Margaret A. Focarino
*Commissioner for Patents of the United States Patent and Trademark Office*